(12) United States Patent
Tokuhara et al.

(10) Patent No.: US 10,658,430 B2
(45) Date of Patent: May 19, 2020

(54) PHOTOSENSOR

(71) Applicant: Panasonic Intellectual Property Management Co., Ltd., Osaka (JP)

(72) Inventors: Takeyoshi Tokuhara, Osaka (JP); Tokuhiko Tamaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/939,381

(22) Filed: Mar. 29, 2018

(65) Prior Publication Data

US 2018/0219047 A1 Aug. 2, 2018

Related U.S. Application Data

(63) Continuation of application No. PCT/JP2016/003348, filed on Jul. 15, 2016.

(30) Foreign Application Priority Data

Nov. 12, 2015 (JP) .................................. 2015-222063
Nov. 12, 2015 (JP) .................................. 2015-222064

(51) Int. Cl.
*H01L 27/30* (2006.01)
*H01L 51/42* (2006.01)
(Continued)

(52) U.S. Cl.
CPC .......... *H01L 27/307* (2013.01); *G01J 1/0407* (2013.01); *G01J 1/42* (2013.01);
(Continued)

(58) Field of Classification Search
CPC . H01L 27/307; H01L 51/4273; H01L 51/442; H01L 51/0077; H01L 51/447
See application file for complete search history.

(56) References Cited

U.S. PATENT DOCUMENTS

| | | | |
|---|---|---|---|
| 5,591,963 A | 1/1997 | Takeda et al. | |
| 2015/0261259 A1* | 9/2015 | Endo | G06F 1/1652 |
| | | | 361/679.06 |

(Continued)

FOREIGN PATENT DOCUMENTS

| | | |
|---|---|---|
| JP | 60-194345 | 10/1985 |
| JP | 62-222668 | 9/1987 |

(Continued)

OTHER PUBLICATIONS

International Search Report of PCT application No. PCT/JP2016/003348 dated Oct. 11, 2016.

*Primary Examiner* — Christine A Enad
(74) *Attorney, Agent, or Firm* — McDermott Will & Emery LLP

(57) ABSTRACT

A photosensor includes: a first electrode; a second electrode; a photoelectric conversion layer that is located between the first and second electrodes and generates electric charges; a first charge blocking layer located between the first electrode and the photoelectric conversion layer; a second charge blocking layer located between the second electrode and the photoelectric conversion layer; a voltage supply circuit that applies a voltage to at least one of the first and second electrodes such that an electric field is generated in the photoelectric conversion layer; and a detection circuit that detects a signal corresponding to a change in capacitance between the first and second electrodes. The first charge blocking layer suppresses movement of electric charges between the photoelectric conversion layer and the first electrode. The second charge blocking layer suppresses movement of electric charges between the photoelectric conversion layer and the second electrode.

13 Claims, 18 Drawing Sheets

(51) Int. Cl.
    *H01L 51/44*     (2006.01)
    *G01J 1/04*     (2006.01)
    *G01J 1/42*     (2006.01)
    *G01J 5/08*     (2006.01)
    *G01J 5/24*     (2006.01)
    *H01L 51/00*     (2006.01)
    *H04N 5/33*     (2006.01)
    *H04N 5/378*     (2011.01)

(52) U.S. Cl.
    CPC ............... *G01J 5/0853* (2013.01); *G01J 5/24* (2013.01); *H01L 51/4273* (2013.01); *H01L 51/442* (2013.01); *H01L 51/0077* (2013.01); *H04N 5/33* (2013.01); *H04N 5/378* (2013.01); *Y02E 10/549* (2013.01)

(56) References Cited

U.S. PATENT DOCUMENTS

| | | | |
|---|---|---|---|
| 2016/0013328 A1* | 1/2016 | Tashiro | H01L 31/0232 250/208.1 |
| 2016/0155954 A1* | 6/2016 | Lim | H01L 51/0061 257/40 |
| 2016/0197281 A1* | 7/2016 | Momose | H01L 51/441 136/256 |

FOREIGN PATENT DOCUMENTS

| | | |
|---|---|---|
| JP | 1-277746 | 11/1989 |
| JP | 2-137267 | 5/1990 |
| JP | 5-090557 | 4/1993 |
| JP | 8-064793 | 3/1996 |
| JP | 2011-060830 | 3/2011 |

\* cited by examiner

PHOTOSENSOR

BACKGROUND

1. Technical Field

The present disclosure relates to a photosensor.

2. Description of the Related Art

Photodetection elements have conventionally been used for photodetectors, image sensors, etc. Typical examples of the photodetection elements include photodiodes and phototransistors. As is well known, when a photoelectric conversion element is irradiated with light, a photocurrent is generated, and the light can be detected by detecting the photocurrent.

Japanese Unexamined Patent Application Publication No. 2011-60830 discloses in FIG. 2 a thin film transistor (TFT) including, as a gate insulating film, an organic film in which a prescribed compound is dispersed in an organic polymer. A compound whose polarization state changes when it is irradiated with light is selected as the compound included in the organic film. In the thin film transistor in Japanese Unexamined Patent Application Publication No. 2011-60830, when the gate insulating film is irradiated with light, the permittivity of the gate insulating film changes. Therefore, an electric current flowing between the source and the drain changes when the gate insulating film is irradiated with light. It is stated in Japanese Unexamined Patent Application Publication No. 2011-60830 that such a thin film transistor can be used for a photosensor.

SUMMARY

One non-limiting and exemplary embodiment provides a photosensor having a novel structure.

In one general aspect, the techniques disclosed here feature a photosensor comprising: a first electrode; a second electrode facing the first electrode; a photoelectric conversion layer located between the first electrode and the second electrode, the photoelectric conversion layer generating electric charges by photoelectric conversion; a first charge blocking layer located between the first electrode and the photoelectric conversion layer; a second charge blocking layer located between the second electrode and the photoelectric conversion layer; a voltage supply circuit connected to at least one of the first electrode and the second electrode, the voltage supply circuit applying a voltage to the at least one of the first electrode and the second electrode such that an electric field directed from the second electrode toward the first electrode is generated in the photoelectric conversion layer; and a detection circuit that detects a signal corresponding to a change in capacitance between the first electrode and the second electrode, the change in capacitance being caused by incident light to the photoelectric conversion layer, wherein the first charge blocking layer suppresses movement of holes from the photoelectric conversion layer to the first electrode and movement of electrons from the first electrode to the photoelectric conversion layer, and the second charge blocking layer suppresses movement of electrons from the photoelectric conversion layer to the second electrode and movement of holes from the second electrode to the photoelectric conversion layer.

It should be noted that general or specific embodiments may be implemented as an element, a device, an apparatus, a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
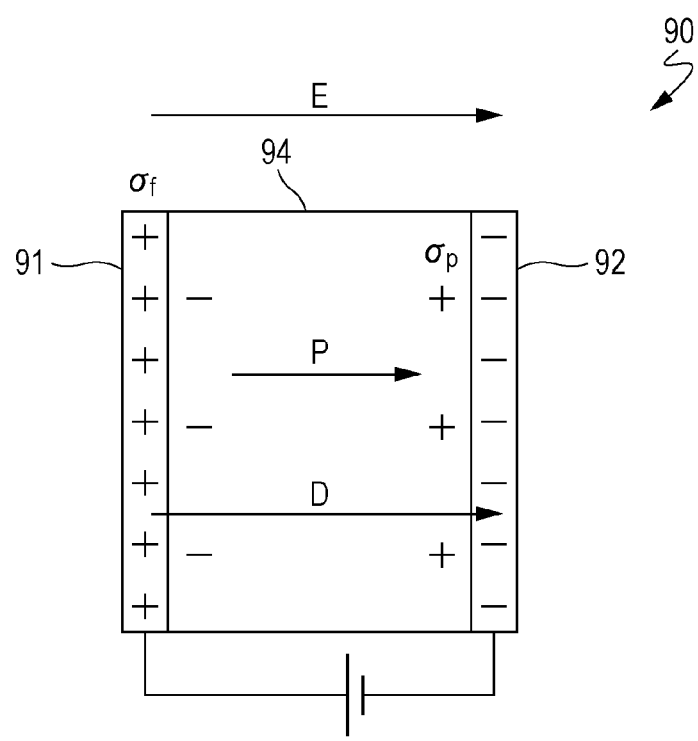
FIG. 1 is a schematic diagram for illustrating a change in permittivity in response to irradiation with light.

Aspects of the present disclosure are summarized as follows.

[Item 1]

A photosensor comprising:

a first electrode and a second electrode, at least one of the first electrode and the second electrode having light-transmitting properties;

a photoelectric conversion layer disposed between the first electrode and the second electrode;

a voltage supply circuit that supplies a first voltage and a second voltage higher than the first voltage to the first electrode and the second electrode, respectively; and a hole blocking layer disposed between the first electrode and the photoelectric conversion layer, wherein the photosensor outputs an electric signal that corresponds to a change in permittivity between the first electrode and the second electrode, the change in permittivity being caused by incident light to the photoelectric conversion layer through at least one of the first electrode and the second electrode.

In the structure in item 1, movement of electric charges generated by photoelectric conversion to the electrodes is suppressed, and the electric charges generated by photoelectric conversion can be utilized as electric charges contributing to the change in permittivity between the two electrodes.

[Item 2]

The photosensor according to item 1, further comprising:

a semiconductor layer disposed between the hole blocking layer and the first electrode; and a third electrode disposed in contact with the semiconductor layer, wherein the first electrode is disposed in contact with the semiconductor layer so as to be spaced apart from the third electrode, and the electric signal is outputted from the third electrode.

In the structure in item 2, the change in permittivity in the dielectric structure between the first electrode and the second electrode can be detected as a change in electric current flowing between the first electrode and the third electrode.

[Item 3]

The photosensor according to item 1 or 2, wherein the ionization potential of the photoelectric conversion layer is higher than the work function of the second electrode.

In the structure in item 3, a potential barrier can be formed between the second electrode and the photoelectric conversion layer. The potential barrier between the second electrode and the photoelectric conversion layer can suppress movement of holes from the second electrode to the photoelectric conversion layer.

[Item 4]

The photosensor according to item 1 or 2, further comprising an electron blocking layer disposed between the second electrode and the photoelectric conversion layer.

In the structure in item 4, the electron blocking layer can effectively suppress movement of electrons from the photoelectric conversion layer to the second electrode.

[Item 5]

A photosensor comprising:

a first electrode and a second electrode, at least one of the first electrode and the second electrode having light-transmitting properties;

a photoelectric conversion layer disposed between the first electrode and the second electrode;

a voltage supply circuit that supplies a first voltage and a second voltage higher than the first voltage to the first electrode and the second electrode, respectively; and an electron blocking layer disposed between the second electrode and the photoelectric conversion layer, wherein the photosensor outputs an electric signal that corresponds to a change in permittivity between the first electrode and the second electrode, the change in permittivity being caused by incident light to the photoelectric conversion layer through at least one of the first electrode and the second electrode.

In the structure in item 5, movement of electric charges generated by photoelectric conversion to the electrodes is suppressed, and the electric charges generated by photoelectric conversion can be utilized as electric charges contributing to the change in permittivity between the two electrodes.

[Item 6]

The photosensor according to item 5, further comprising:

a semiconductor layer disposed between the electron blocking layer and the second electrode; and a third electrode disposed in contact with the semiconductor layer, wherein the second electrode is disposed in contact with the semiconductor layer so as to be spaced apart from the third electrode, and the electric signal is outputted from the third electrode.

In the structure in item 6, the change in permittivity in the dielectric structure between the first electrode and the second electrode can be detected as a change in electric current flowing between the second electrode and the third electrode.

[Item 7]

The photosensor according to item 5 or 6, wherein the electron affinity of the photoelectric conversion layer is lower than the work function of the first electrode.

In the structure in item 7, a potential barrier can be formed between the first electrode and the photoelectric conversion layer. The potential barrier between the first electrode and the photoelectric conversion layer can suppress movement of electrons from the first electrode to the photoelectric conversion layer.

[Item 8]

The photosensor according to item 5 or 6, further comprising a hole blocking layer disposed between the first electrode and the photoelectric conversion layer.

In the structure in item 8, the hole blocking layer can effectively suppress movement of holes from the photoelectric conversion layer to the first electrode.

[Item 9]

A photosensor comprising:

a first electrode and a second electrode, at least one of the first electrode and the second electrode having light-transmitting properties;

a photoelectric conversion layer disposed between the first electrode and the second electrode;

a voltage supply circuit that supplies a first voltage and a second voltage higher than the first voltage to the first electrode and the second electrode, respectively; and an insulating layer disposed between the first electrode and the photoelectric conversion layer, wherein the photosensor outputs an electric signal that corresponds to a change in permittivity between the first electrode and the second electrode, the change in permittivity being caused by incident light to the photoelectric conversion layer through at least one of the first electrode and the second electrode.

In the structure in item 9, movement of electric charges generated by photoelectric conversion to the electrodes is suppressed, and the electric charges generated by photoelectric conversion can be utilized as electric charges contributing to the change in permittivity between the two electrodes.

[Item 10]

The photosensor according to item 9, further comprising:

a semiconductor layer disposed between the insulating layer and the first electrode; and a third electrode disposed in contact with the semiconductor layer, wherein the first electrode is disposed in contact with the semiconductor layer so as to be spaced apart from the third electrode, and the electric signal is outputted from the third electrode.

In the structure in item 10, the change in permittivity in the dielectric structure between the first electrode and the second electrode can be detected as a change in electric current flowing between the first electrode and the third electrode.

[Item 11]

The photosensor according to item 9 or 10, wherein the ionization potential of the photoelectric conversion layer is higher than the work function of the second electrode.

In the structure in item 11, a potential barrier can be formed between the second electrode and the photoelectric conversion layer. The potential barrier between the second electrode and the photoelectric conversion layer can suppress movement of electrons from the second electrode to the photoelectric conversion layer.

[Item 12]

The photosensor according to item 9 or 10, further comprising a second insulating layer disposed between the second electrode and the photoelectric conversion layer.

In the structure in item 12, the second insulating layer disposed between the second electrode and the photoelectric conversion layer can more reliably suppress the movement of the electric charges between the second electrode and the photoelectric conversion layer.

[Item 13]

A photosensor comprising:

a first electrode and a second electrode, at least one of the first electrode and the second electrode having light-transmitting properties;

a photoelectric conversion layer disposed between the first electrode and the second electrode;

a voltage supply circuit that supplies a first voltage and a second voltage higher than the first voltage to the first electrode and the second electrode, respectively; and an insulating layer disposed between the second electrode and the photoelectric conversion layer, wherein the photosensor outputs an electric signal that corresponds to a change in permittivity between the first electrode and the second electrode, the change in permittivity being caused by incident light to the photoelectric conversion layer through at least one of the first electrode and the second electrode.

In the structure in item 13, movement of electric charges generated by photoelectric conversion to the electrodes is suppressed, and the electric charges generated by photoelectric conversion can be utilized as electric charges contributing to the change in permittivity between the two electrodes.

[Item 14]

The photosensor according to item 13, further comprising:

a semiconductor layer disposed between the insulating layer and the second electrode; and a third electrode disposed in contact with the semiconductor layer, wherein the second electrode is disposed in contact with the semiconductor layer so as to be spaced apart from the third electrode, and the electric signal is outputted from the third electrode.

In the structure in item 14, the change in permittivity in the dielectric structure between the first electrode and the second electrode can be detected as a change in electric current flowing between the second electrode and the third electrode.

[Item 15]

The photosensor according to item 13 or 14, wherein the electron affinity of the photoelectric conversion layer is higher than the work function of the first electrode.

In the structure in item 15, a potential barrier can be formed between the first electrode and the photoelectric conversion layer. The potential barrier between the first electrode and the photoelectric conversion layer can suppress movement of electrons from the first electrode to the photoelectric conversion layer.

[Item 16]

The photosensor according to item 13 or 14, further comprising a second insulating layer disposed between the first electrode and the photoelectric conversion layer.

In the structure in item 16, the second insulating layer disposed between the first electrode and the photoelectric conversion layer can more reliably suppress the movement of electric charges between the first electrode and the photoelectric conversion layer.

[Item 17]

A photosensor comprising:

a first electrode;

a second electrode facing the first electrode;

a photoelectric conversion layer located between the first electrode and the second electrode, the photoelectric conversion layer generating electric charges by photoelectric conversion;

a first charge blocking layer located between the first electrode and the photoelectric conversion layer;

a second charge blocking layer located between the second electrode and the photoelectric conversion layer;

a voltage supply circuit connected to at least one of the first electrode and the second electrode, the voltage supply circuit applying a voltage to the at least one of the first electrode and the second electrode such that an electric field directed from the second electrode toward the first electrode is generated in the photoelectric conversion layer; and a detection circuit that detects a signal corresponding to a change in capacitance between the first electrode and the second electrode, the change in capacitance being caused by incident light to the photoelectric conversion layer, wherein the first charge blocking layer suppresses movement of holes from the photoelectric conversion layer to the first electrode and movement of electrons from the first electrode to the photoelectric conversion layer, and the second charge blocking layer suppresses movement of electrons from the photoelectric conversion layer to the second electrode and movement of holes from the second electrode to the photoelectric conversion layer.

[Item 18]

The photosensor according to item 17, wherein the voltage supply circuit applies a voltage to one of the first electrode and the second electrode, and the detection circuit detects a voltage of the other one of the first electrode and the second electrode.

[Item 19]

The photosensor according to item 18, further comprising a capacitor having a first end connected to the other one of the first electrode and the second electrode and a second end to which a prescribed voltage is applied.

[Item 20]

The photosensor according to item 17, further comprising:

a semiconductor layer located between the second charge blocking layer and the second electrode, the semiconductor layer being in contact with the second electrode; and a third electrode in contact with the semiconductor layer, wherein the voltage supply circuit applies a voltage to the first electrode and the second electrode, and the detection circuit detects an electric current flowing between the second electrode and the third electrode.

[Item 21]

The photosensor according to item 17, further comprising:

a semiconductor layer located between the first charge blocking layer and the first electrode, the semiconductor layer being in contact with the first electrode; and a third electrode in contact with the semiconductor layer, wherein the voltage supply circuit applies a voltage to the first electrode and the second electrode, and the detection circuit detects an electric current flowing between the first electrode and the third electrode.

[Item 22]

The photosensor according to item 17, wherein the voltage supply circuit applies, between the first electrode and the second electrode, a voltage obtained by superimposing a first voltage on a second voltage, the first voltage having an amplitude that varies periodically, the second voltage being a DC voltage that causes an electric field directed from the second electrode toward the first electrode to be generated in the photoelectric conversion layer, and the detection circuit detects an electric current flowing between the first electrode and the second electrode.

[Item 23]

The photosensor according to item 17, further comprising a current supply circuit that applies, between the first electrode and the second electrode, an electric current having an amplitude that varies periodically, wherein the voltage supply circuit applies a DC voltage between the first electrode and the second electrode such that an electric field directed from the second electrode toward the first electrode is generated in the photoelectric conversion layer, and the detection circuit detects a potential difference between the first electrode and the second electrode.

[Item 24]

The photosensor according to any one of items 17 to 23, wherein the HOMO level of the first charge blocking layer is deeper than the HOMO level of the photoelectric conversion layer by at least 0.3 eV, and the LUMO level of the first charge blocking layer is shallower than the Fermi level of the first electrode by at least 0.3 eV.

[Item 25]

The photosensor according to any one of items 17 to 24, wherein the LUMO level of the second charge blocking layer is shallower than the LUMO level of the photoelectric conversion layer by at least 0.3 eV, and the HOMO level of the second charge blocking layer is deeper than the Fermi level of the second electrode by at least 0.3 eV.

[Item 26]

The photosensor according to any one of items 17 to 25, wherein at least one of the first charge blocking layer and the second charge blocking layer is an insulating layer.

[Item 27]

A photosensor comprising:

a first electrode;

a second electrode facing the first electrode;

a photoelectric conversion layer located between the first electrode and the second electrode, the photoelectric conversion layer generating electric charges by photoelectric conversion;

a first insulating layer located between the first electrode and the photoelectric conversion layer;

a second insulating layer located between the second electrode and the photoelectric conversion layer;

a voltage supply circuit connected to at least one of the first electrode and the second electrode, the voltage supply circuit applying a voltage to the at least one of the first electrode and the second electrode such that an electric field is generated in the photoelectric conversion layer; and a detection circuit that detects a signal corresponding to a change in capacitance between the first electrode and the second electrode, the change in capacitance being caused by incident light to the photoelectric conversion layer.

[Item 28]

The photosensor according to item 27, wherein the voltage supply circuit applies a voltage to one of the first electrode and the second electrode, and the detection circuit detects a voltage at the other one of the first electrode and the second electrode.

[Item 29]

The photosensor according to item 28, further comprising a capacitor having a first end connected to the other one of the first electrode and the second electrode and a second end to which a prescribed voltage is applied.

[Item 30]

The photosensor according to item 27, further comprising:

a semiconductor layer located between the second insulating layer and the second electrode, the semiconductor layer being in contact with the second electrode; and a third electrode in contact with the semiconductor layer, wherein the voltage supply circuit applies a voltage to the first electrode and the second electrode, and the detection circuit detects an electric current flowing between the second electrode and the third electrode.

[Item 31]

The photosensor according to item 27, wherein the voltage supply circuit applies, between the first electrode and the second electrode, voltage obtained by superimposing a first voltage on a second voltage, the first voltage having an amplitude that varies periodically, the second voltage being a DC voltage that causes an electric field directed from the second electrode toward the first electrode to be generated in the photoelectric conversion layer, and the detection circuit detects an electric current flowing between the first electrode and the second electrode.

[Item 32]

The photosensor according to item 27, further comprising a current supply circuit that applies, between the first electrode and the second electrode, an electric current having an amplitude that varies periodically, wherein the voltage supply circuit applies a DC voltage between the first electrode and the second electrode such that an electric field directed from the second electrode toward the first electrode is generated in the photoelectric conversion layer, and the detection circuit detects a potential difference between the first electrode and the second electrode.

Embodiments of the present disclosure will next be described in detail with reference to the drawings. The embodiments described below show general or specific examples. Numerical values, shapes, materials, components, arrangements and connections of the components, steps, the order of the steps, etc. shown in the following embodiments are examples and are not intended to limit the present disclosure. Various aspects described herein can be mutually combined so long as no conflict arises. Among the components in the following embodiments, components not described in independent claims representing the broadest concepts are described as optional components. In the following description, components having substantially the same functions are denoted by the same reference numerals, and their description may be omitted.

(Principle of Photodetection)

Before the embodiments of the present disclosure are described in detail, an outline of the principle of photodetection will first be described. As will be described later in detail with reference to the drawings, a photosensor according to an embodiment of the present disclosure includes a photodetection element having a general structure in which a dielectric structure is sandwiched between two electrodes. The dielectric structure disposed between the two electrodes typically includes a photoelectric conversion layer that generates electric charges when irradiated with light. In the embodiments described below, light is detected by using a change in the permittivity of the dielectric structure due to the light entering the photoelectric conversion layer.

FIG. 1 is an illustration for describing the outline of the principle of photodetection in an embodiment of the present disclosure. FIG. 1 schematically shows an element 90 including two electrodes 91 and 92 and a dielectric structure 94 sandwiched between them. FIG. 1 schematically shows the state in which a DC power source is connected to the electrodes 91 and 92 and an electric field is thereby applied from the outside to the dielectric structure 94.

When the electric field is formed between the electrode 91 and the electrode 92, polarization occurs in the dielectric structure 94. An arrow P in FIG. 1 represents dielectric polarization in the dielectric structure 94. An arrow D represents electric flux density. $\sigma_f$ is the density of electric charges in the electrodes, and $\sigma_p$ is the density of electric charges generated by polarization within the dielectric structure 94 at its surfaces facing the electrodes.

Let the magnitude of the electric field in the dielectric structure 94 be E. According to the Gauss' law, $E=((\sigma_f-\sigma_p)/\varepsilon_0)$ and $E=(\sigma_f/\varepsilon)$ hold. $\varepsilon_0$ and $\varepsilon$ are the permittivity of vacuum and the permittivity of the dielectric structure 94, respectively. From $E=((\sigma_f-\sigma_p)/\varepsilon_0)$ and $E=(\sigma_f/\varepsilon)$, $\varepsilon=\varepsilon_0 (\sigma_f/(\sigma_f-\sigma_p))$ is obtained. As can be seen from this formula, as the charge density $\sigma_p$ increases, the permittivity of the dielectric structure 94 increases.

In this embodiment of the present disclosure, the dielectric structure 94 used is a structure including a photoelectric conversion layer. Therefore, when light enters the dielectric structure 94, hole-electron pairs are generated in the photoelectric conversion layer. In this example, since a prescribed voltage is supplied between the electrodes 91 and 92 disposed so as to face each other with the dielectric structure 94 interposed therebetween, an electric field directed from the electrode 91 toward the electrode 92 is formed in the photoelectric conversion layer in the dielectric structure 94. This causes the holes and electrons formed in the photoelectric conversion layer by photoelectric conversion to be separated from each other. Part of the holes move toward the electrode 92, and part of the electrons move toward the electrode 91.

Suppose that the electric charges generated by photoelectric conversion are not extracted from the dielectric structure 94 to the outside through the electrode 91 or the electrode 92. In other words, the holes and electrons generated by photoelectric conversion are separated from each other, and the separated state is maintained. In this case, the separated charges cause the charge density $\sigma_p$ to increase effectively. When the charge density $\sigma_p$ increases, the permittivity of the dielectric structure 94 increases, as described above. This means that, when light enters the dielectric structure 94, the permittivity between the electrodes 91 and 92 changes. Specifically, by separating the holes and electrons generated by photoelectric conversion from each other while the separated charges are retained in the dielectric structure, the capacitance value between the electrode 91 and the electrode 92 is changed. By detecting the change in the capacitance value, the light entering the dielectric structure 94 can be detected.

Photosensors in the embodiments described below each have a structure capable of detecting light on the basis of a change in permittivity between two electrodes. It should be noted that, in the embodiments of the present disclosure, no electric charges are exchanged between the photoelectric conversion layer and the electrodes. Specifically, the electric charges generated in the photoelectric conversion layer by irradiation with light are retained within the photoelectric conversion layer and are basically not transferred to the electrodes. Basically, no electric charges are supplied from the electrodes to the photoelectric conversion layer. This is one of the differences from conventional solar cells and light emitting diodes utilizing photoelectric conversion.

(First Embodiment of Photosensor)

Figure 2:
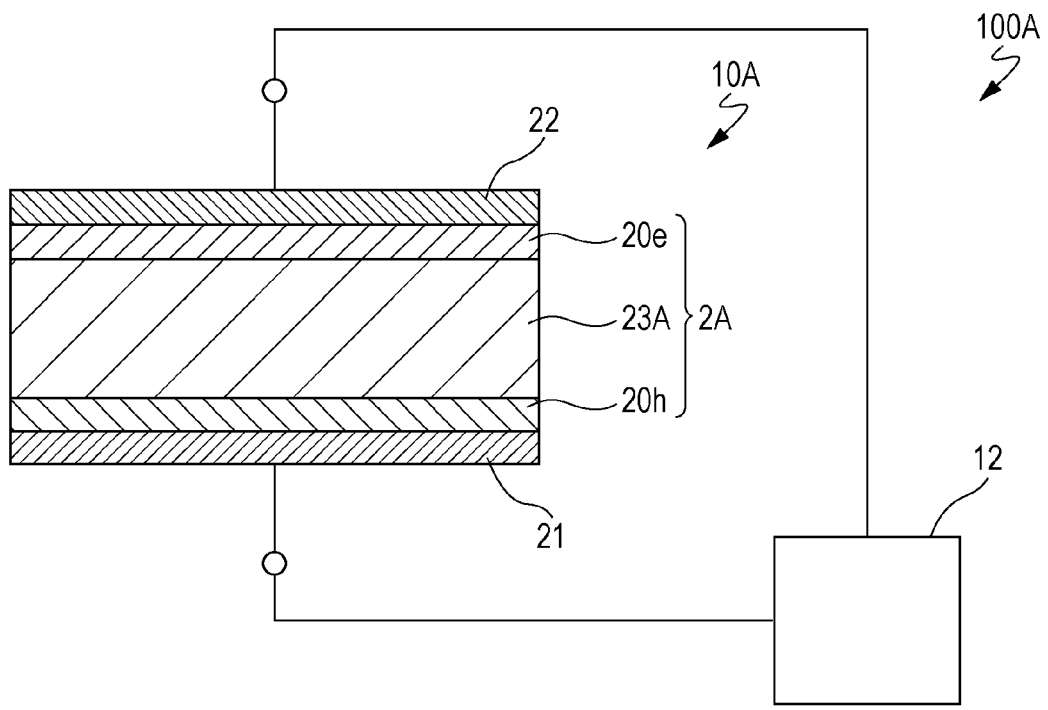
FIG. 2 is a schematic diagram illustrating an exemplary structure of a photosensor according to a first embodiment of the present disclosure.

FIG. 2 shows the outline of an exemplary structure of a photosensor according to a first embodiment of the present disclosure. The photosensor 100A shown in FIG. 2 includes a photodetection element 10A and a voltage supply circuit 12 connected to the photodetection element 10A. The photodetection element 10A includes a first electrode 21, a second electrode 22, and a dielectric structure 2A disposed therebetween and including a photoelectric conversion layer 23A. FIG. 2 shows only schematically the arrangement of the components forming the photodetection element 10A, and the dimensions of the components shown in FIG. 2 do not strictly reflect the dimensions of an actual device. The same also applies to other figures in the present disclosure.

Typically, a semiconductor material is used as the material forming the photoelectric conversion layer 23A. In the photoelectric conversion layer 23A, electron-hole pairs are generated in response to irradiation with light. In this case, an organic semiconductor material is used as the material forming the photoelectric conversion layer 23A. The details of the photoelectric conversion layer 23A will be described later.

The voltage supply circuit 12 is configured such that prescribed voltages can be applied to the first electrode 21 and the second electrode 22. During photodetection, the voltage supply circuit 12 supplies a first voltage to the first electrode 21 and supplies a second voltage higher than the first voltage to the second electrode 22. The voltage supply circuit 12 is not limited to a specific power source circuit but may be a circuit generating the prescribed voltages or may be a circuit that converts a voltage supplied from another power source to the prescribed voltages. The first voltage and/or the second voltage may be applied in the form of pulses, or the application of the first voltage and/or the second voltage may be repeated periodically or quasi-periodically.

At least one of the first electrode 21 and the second electrode 22 is a transparent electrode. For example, when the second electrode 22 is a transparent electrode, the photoelectric conversion layer 23A receives light passing through the second electrode 22. Of course, the first electrode 21 to which the lower voltage is applied during photodetection may be a transparent electrode, or both the first electrode 21 and the second electrode 22 may be transparent electrodes.

The term "transparent" as used herein means that at least part of light in a detection wavelength range is allowed to pass through, and it is not necessary that light in the entire visible wavelength range be allowed to pass through. The light detected by the photosensor of the present disclosure is not limited to light in the visible wavelength range (e.g., of from 380 nm to 780 nm inclusive). Herein, general electromagnetic waves including infrared rays and ultraviolet rays are expressed as "light" for convenience.

In the structure exemplified in FIG. 2, the dielectric structure 2A includes a hole blocking layer 20h disposed between the first electrode 21 and the photoelectric conversion layer 23A. The dielectric structure 2A further includes an electron blocking layer 20e disposed between the second electrode 22 and the photoelectric conversion layer 23A. The hole blocking layer 20h and the electron blocking layer 20e have the function of retaining, within the photoelectric conversion layer 23A, electric charges generated in the photoelectric conversion layer 23A by photoelectric conversion. Specifically, the hole blocking layer 20h has the function of suppressing movement of the holes generated by photoelectric conversion to the first electrode 21. The electron blocking layer 20e has the function of suppressing movement of the electrons generated by photoelectric conversion to the second electrode 22.

Figure 3:
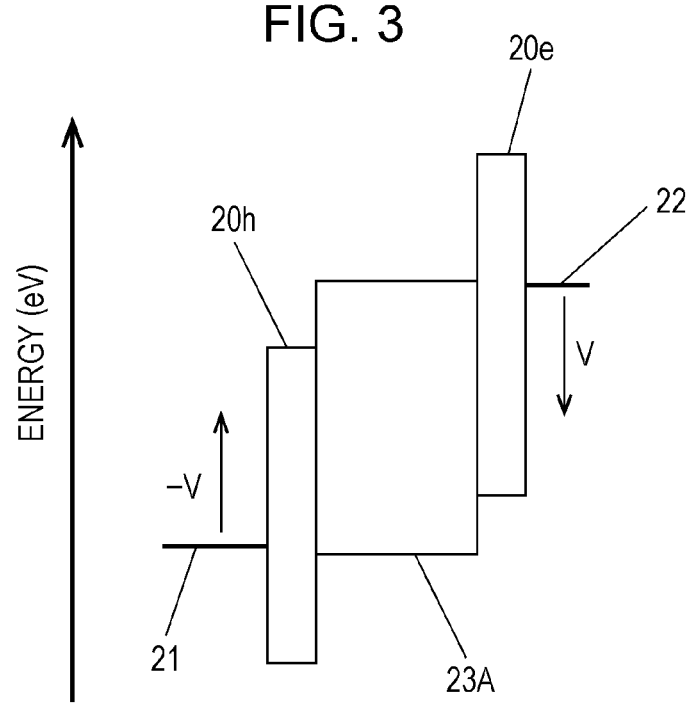
FIG. 3 is an exemplary energy diagram of a photodetection element 10A shown in FIG. 2.

FIG. 3 is an exemplary energy diagram of the photodetection element 10A. In FIG. 3, a thick horizontal line on the left of three rectangles represents the Fermi level of the first electrode 21, and a thick horizontal line on the right of the three rectangles represents the Fermi level of the second electrode 22. In FIG. 3, the base of the leftmost one of the three rectangles represents the energy level of the highest occupied molecular orbital (HOMO) of the hole blocking layer 20h, and its side opposed to the base represents the energy level of the lowest unoccupied molecular orbital (LUMO). Similarly, the central and right rectangles in FIG. 3 schematically represent the HOMO and LUMO energy levels of the photoelectric conversion layer 23A and the electron blocking layer 20e, respectively. The same applies to other energy diagrams, unless otherwise specified.

During the photodetection operation, the first voltage is supplied from the voltage supply circuit 12 (not shown in FIG. 3, see FIG. 2) to the first electrode 21, and the second voltage higher than the first voltage is applied to the second electrode 22. Specifically, an electric field directed from the right to the left in FIG. 3 is applied to the photoelectric conversion layer 23A from the outside. Thin arrows in the energy diagram shown in FIG. 3 schematically indicate the directions of the voltages applied to the first electrode 21 and the second electrode 22.

When light enters the photoelectric conversion layer 23A with the first voltage and the second voltage applied to the first electrode 21 and the second electrode 22, respectively, at least part of electric charges generated by photoelectric conversion move along the electric field generated by the application of the first voltage and the second voltage. For example, the electrons generated move within the photoelectric conversion layer 23A toward the second electrode 22.

However, since the electron blocking layer 20e is disposed between the photoelectric conversion layer 23A and the second electrode 22, movement of electrons from the photoelectric conversion layer 23A to the second electrode 22 is blocked by an energy barrier between the photoelectric conversion layer 23A and the electron blocking layer 20e. Similarly, movement of holes from the photoelectric conversion layer 23A to the first electrode 21 is blocked by an energy barrier between the photoelectric conversion layer 23A and the hole blocking layer 20h. Specifically, movement of the electric charges generated by photoelectric conversion to the electrodes is suppressed, and the electric charges generated are retained within the photoelectric conversion layer 23A. As described above, in this embodiment of the present disclosure, the movement of the electric charges generated by photoelectric conversion to the electrodes is suppressed.

In the example shown in FIG. 3, the difference between the HOMO energy level of the photoelectric conversion layer 23A and the HOMO energy level of the hole blocking layer 20h is relatively large. Therefore, a relatively large potential barrier for holes is formed between the photoelectric conversion layer 23A and the hole blocking layer 20h. In this case, almost no holes move from the photoelectric conversion layer 23A to the hole blocking layer 20h. The HOMO energy level of the hole blocking layer 20h is deeper by desirably at least 0.3 eV and more desirably at least 0.7 eV than the HOMO energy level of the photoelectric conversion layer 23A. Similarly, in the example shown in FIG. 3, the difference between the LUMO energy level of the electron blocking layer 20e and the LUMO energy level of the photoelectric conversion layer 23A is relatively large, and therefore a relatively large potential barrier for electrons is formed between the electron blocking layer 20e and the photoelectric conversion layer 23A. In this case, almost no electrons move from the photoelectric conversion layer 23A to the electron blocking layer 20e. The LUMO energy level of the electron blocking layer 20e is shallower than the LUMO energy level of the photoelectric conversion layer 23A by desirably at least 0.3 eV and more desirably at least 0.7 eV.

In the above description, the hole blocking layer, the electron blocking layer, and the photoelectric conversion layer are formed of organic materials. However, when these layers are formed of inorganic compounds, their HOMO is replaced with a valence band, and their LUMO is replaced with a conduction band.

In the example shown in FIG. 3, the difference between the Fermi level of the first electrode 21 and the LUMO energy level of the hole blocking layer 20h is relatively large. Therefore, a relatively high potential barrier for electrons is formed between the first electrode 21 and the hole blocking layer 20h. In this case, almost no electrons are injected from the first electrode 21 into the hole blocking layer 20h. The LUMO energy level of the hole blocking layer 20h is shallower than the Fermi level of the first electrode 21 by desirably at least 0.3 eV and more desirably at least 0.7 eV. Similarly, in the example shown in FIG. 3, the difference between the HOMO energy level of the electron blocking layer 20e and the Fermi level of the second electrode 22 is relatively large. Therefore, a relatively high potential barrier for holes is formed between the electron blocking layer 20e and the second electrode 22. In this case, almost no holes are injected from the second electrode 22 into the electron blocking layer 20e. The HOMO energy level of the electron blocking layer 20e is deeper than the Fermi level of the second electrode 22 by desirably at least 0.3 eV and more desirably at least 0.7 eV.

In the above description, the hole blocking layer, the electron blocking layer, and the photoelectric conversion layer are formed of organic materials. When these layers are formed of inorganic materials, their HOMO is replaced with a valence band, and their LUMO is replaced with a conduction band.

In this embodiment of the present disclosure, movement of electric charges between the photoelectric conversion layer 23A and the first electrode 21 and movement of electric charges between the photoelectric conversion layer 23A and the second electrode 22 are suppressed. For example, the current density between the first electrode 21 and the second electrode 22 one second after the application of the voltage between the first electrode 21 and the second electrode 22 can be $1 \times 10^{-9}$ A/cm$^2$ or less. As described above, in this embodiment of the present disclosure, the electric charges generated by photoelectric conversion can be utilized as electric charges contributing to the change in the permittivity between the two electrodes (the first electrode 21 and the second electrode 22 in this case).

The photodetection element 10A exemplified above includes the photoelectric conversion layer 23A formed using an organic semiconductor material. Known examples of a device utilizing photoelectric conversion by an organic thin film include an imaging element having an organic thin film and an organic thin film solar cell. Functional layers such as the hole blocking layer and electron blocking layer may be used in the above devices. However, the conventional structures differ from the structure in this embodiment of the present disclosure in that the conventional structures must be configured such that electric charges generated by photoelectric conversion can be extracted from the photoelectric conversion layer to the electrodes along an electric field.

Figure 4:
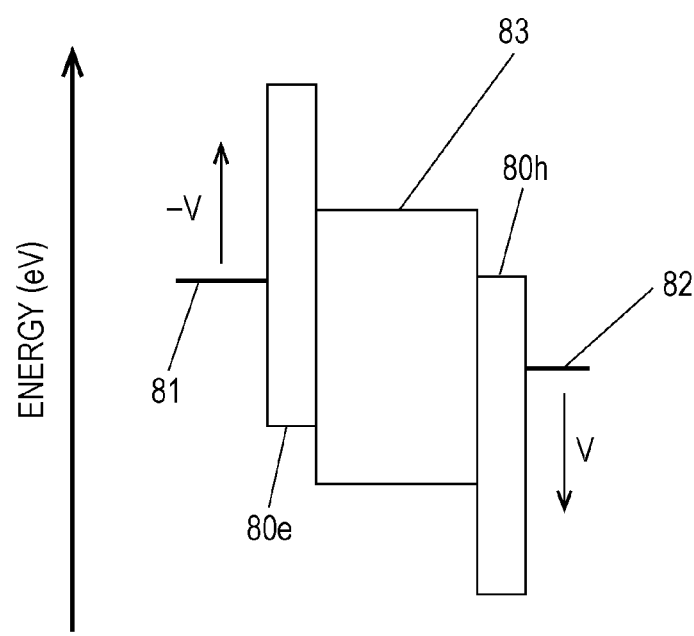
FIG. 4 is an exemplary energy diagram of an imaging element having an organic thin film and shown as a comparative example.

FIG. 4 is an exemplary energy diagram of an imaging element having an organic thin film and shown as a comparative example. In the structure shown in FIG. 4, a hole blocking layer 80h is disposed between a pixel electrode 82 and a photoelectric conversion layer 83, and an electron blocking layer 80e is disposed between the photoelectric conversion layer 83 and a transparent electrode 81 (e.g., an ITO electrode) disposed so as to face the pixel electrode 82.

Generally, in the imaging element using the organic thin film, a prescribed voltage is applied to the transparent electrode 81, and holes or electrons generated in the photoelectric conversion layer 83 are thereby collected as signal charges by the pixel electrode 82. For example, when a negative voltage is applied to the transparent electrode 81, the pixel electrode 82 collects, as signal charges, electrons generated in the photoelectric conversion layer 83 by photoelectric conversion. For example, Al, TiN, Cu, Al, TaN, or ITO is used as the material of the pixel electrode 82.

It should be noted that, in the conventional imaging element using the organic thin film, unlike in the photodetection element 10A described above, no hole blocking layer 80h is disposed between the photoelectric conversion layer 83 and the electrode to which a lower voltage is applied (the transparent electrode 81 in this case). Similarly, in the conventional imaging element using the organic thin film, no electron blocking layer 80e is disposed between the photoelectric conversion layer 83 and the electrode to which a higher voltage is applied (the pixel electrode 82 in this case).

As schematically shown in FIG. 4, in the imaging element in the comparative example, the hole blocking layer 80h is disposed between the photoelectric conversion layer 83 and the electrode whose potential is higher during operation (the pixel electrode 82 in this case). The electron blocking layer 80e is disposed between the photoelectric conversion layer 83 and the electrode whose potential is lower during operation (the transparent electrode 81 in this case). Specifically, in the conventional imaging element using the organic thin film, the arrangement of the hole blocking layer and the electron blocking layer relative to the photoelectric conversion layer is inverted from that in the photosensor according to this embodiment of the present disclosure. This is because, in the conventional imaging element using the organic thin film, the hole blocking layer 80h is provided for the purpose of allowing the electrons generated by photoelectric conversion to selectively pass therethrough from the photoelectric conversion layer 83 to the pixel electrode 82 while injection of holes from the pixel electrode 82 is suppressed. This is also because, in the conventional imaging element using the organic thin film, the electron blocking layer 80e is provided for the purpose of allowing the holes generated by photoelectric conversion to selectively pass therethrough from the photoelectric conversion layer 83 to the transparent electrode 81 while injection of electrons from the transparent electrode 81 is suppressed. Also in a solar cell using an organic thin film, its hole blocking layer must have the function of allowing electrons to selectively pass through while holes are blocked, and its electron blocking layer must have the function of allowing holes to selectively pass through while electrons are blocked.

The rate of discharge of electric charges from the photoelectric conversion layer 83 and the rate of inflow of electric charges into the photoelectric conversion layer 83 are low. As described above, in this embodiment of the present disclosure, no electric charges are exchanged between the photoelectric conversion layer 23A and the first electrode 21 and between the photoelectric conversion layer 23A and the second electrode 22. In this embodiment of the present disclosure, it is only necessary that the positive and negative charges generated by photoelectric conversion be separated from each other, and detection can be performed at relatively high speed. Therefore, this embodiment of the present disclosure is advantageously applied to an image sensor. In the photosensor according to this embodiment of the present disclosure, the holes or electrons generated by photoelectric conversion are not extracted as signal charges, and the amount of the signal charges is not read, so that a so-called reset operation is unnecessary. In the photosensor according to this embodiment of the present disclosure, when the application of the electric field to the photoelectric conversion layer is stopped, the holes and the electrons are recombined, and the permittivity of the dielectric structure that has been increased by irradiation with light decreases. Specifically, in this embodiment of the present disclosure, a reset operation performed by supplying a reset voltage is unnecessary, and this is advantageous to increase the speed of operation. It is unnecessary to provide a separate reset circuit, and this is advantageous for miniaturization.

In this embodiment of the present disclosure, the configuration of the hole blocking layer 20h and the electron blocking layer 20e in the photodetection element (e.g., the photodetection element 10A) is determined such that movement of electric charges from the photoelectric conversion layer 23A to the first electrode 21 and movement of electric charges from the photoelectric conversion layer 23A to the second electrode 22 can be suppressed. For example, the materials of the first electrode 21, the hole blocking layer 20h, the photoelectric conversion layer 23A, the electron blocking layer 20e, and the second electrode 22 and the values of the first and second voltages are selected such that the relative relations among the energy levels of the components of the photodetection element 10A and the direction of the voltage applied between the first electrode 21 and the second electrode 22 are as shown in FIG. 3.

As described above, in the photosensor 100A, the movement of electric charges from the photoelectric conversion layer 23A to the first electrode 21 and the movement of electric charges from the photoelectric conversion layer 23A to the second electrode 22 are suppressed. Therefore, the electric charges generated when light enters the photoelectric conversion layer 23A through the first electrode 21 and/or the second electrode 22 are retained within the photoelectric conversion layer 23A. Since the electric charges generated by photoelectric conversion are retained within the photoelectric conversion layer 23A, the permittivity of the dielectric structure 2A including the photoelectric conversion layer 23A increases. Specifically, the capacitance value between the first electrode 21 and the second electrode 22 in the photosensor 100A changes when light enters the photosensor 100A. By detecting the change in the capacitance value between the first electrode 21 and the second electrode 22 as a change in electric current or voltage using an appropriate detection circuit, the light entering the photosensor 100A can be detected. As described above, the photosensor 100A can generate a signal corresponding to the change in the permittivity of the dielectric structure 2A caused by the incident light.

The first voltage and/or second voltage is not necessarily a steady constant voltage and may be a voltage varying with time. In this embodiment of the present disclosure, the second voltage used is higher than the first voltage. However, this is not intended to completely exclude the presence of the state in which the second voltage is equal to the first voltage. The second voltage is not limited to a voltage that is always higher than the first voltage. When the voltages vary with time, the second voltage may be equal to the first voltage in some instances.

One of the hole blocking layer 20h and the electron blocking layer 20e can be omitted by selecting an appropriate combination of the materials of the first electrode 21, the photoelectric conversion layer 23A, and the second electrode 22 in consideration of the magnitude of the ionization potential or electron affinity of the photoelectric conversion layer 23A and the magnitudes of the work functions of the electrodes (the first electrode 21 and the second electrode 22). Examples of such a structure will be described later. The work function of an electrode is defined as the difference between the vacuum level and the Fermi level of the electrode. The ionization potential is defined as the difference between the vacuum level and the HOMO, and the electron affinity is defined as the difference between the vacuum level and the LUMO. In the following description, the values of the work function, the ionization potential, and the electron affinity may be denoted by WF, IP, and EA, respectively.

Examples of the structures of the photoelectric conversion layer 23A, the hole blocking layer 20h, and the electron blocking layer 20e will be described in detail.

(Photoelectric Conversion Layer)

The photoelectric conversion layer 23A contains, for example, tin naphthalocyanine represented by general formula (1) below (hereinafter may be referred to simply as "tin naphthalocyanine").

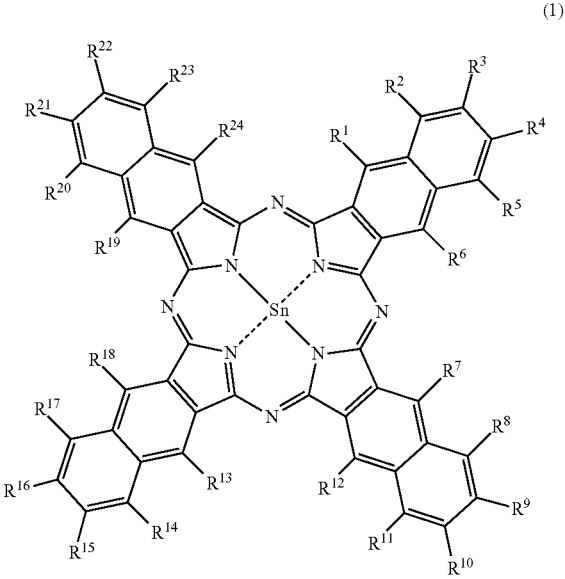

(1)

In general formula (1), $R^1$ to $R^{24}$ each independently represent a hydrogen atom or a substituent. The substituent is not limited to a specific substituent. The substituent may be selected from a deuterium atom, halogen atoms, alkyl groups (including cycloalkyl groups, bicycloalkyl groups, and tricycloalkyl groups), alkenyl groups (including cycloalkenyl groups and bicycloalkenyl groups), alkynyl groups, allyl groups, heterocyclic groups, a cyano group, a hydroxy group, a nitro group, a carboxy group, alkoxy groups, allyloxy groups, silyloxy groups, heterocyclic oxy groups, acyloxy groups, a carbamoyloxy group, alkoxycarbonyloxy groups, allyloxycarbonyloxy groups, amino groups (including an anilino group), an ammonio group, acylamino groups, an aminocarbonylamino group, alkoxycarbonylamino groups, allyloxycarbonylamino groups, a sulfamoylamino group, alkylsulfonylamino groups, allylsulfonylamino groups, a mercapto group, alkylthio groups, allylthio groups, heterocyclic thio groups, a sulfamoyl group, a sulfo group, alkylsulfinyl groups, allylsulfinyl groups, alkylsulfonyl groups, allylsulfonyl groups, acyl groups, allyloxycarbonyl groups, alkoxycarbonyl groups, a carbamoyl group, allylazo groups, heterocyclic azo groups, an imido group, phosphino groups, phosphinyl groups, phosphinyloxy groups, phosphinylamino groups, a phosphono group, silyl groups, a hydrazino group, a ureido group, a borate group (—B(OH)$_2$), a phosphate group (—OPO(OH)$_2$), a sulfate group (—OSO$_3$H), and other well-known substituents.

A commercial product may be used as the tin naphthalocyanine represented by general formula (1) above. Alternatively, as shown in, for example, Japanese Unexamined Patent Application Publication No. 2010-232410, the tin naphthalocyanine represented by general formula (1) above can be synthesized using a naphthalene derivative represented by general formula (2) below as a starting material. $R^{25}$ to $R^{30}$ in general formula (2) may be selected from the same substituents as those for $R^1$ to $R^{24}$ in general formula (1).

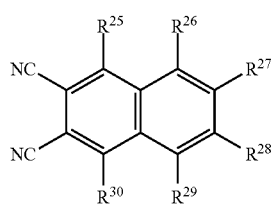

(2)

In the tin naphthalocyanine represented by general formula (1) above, it is beneficial, in terms of ease of controlling the cohesion state of the molecules, that at least eight of $R^1$ to $R^{24}$ are each a hydrogen atom or a deuterium atom. It is more beneficial that at least sixteen of $R^1$ to $R^{24}$ are each a hydrogen atom or a deuterium atom, and it is still more beneficial that all of $R^1$ to $R^{24}$ are each a hydrogen atom or a deuterium atom. Tin naphthalocyanine represented by formula (3) below is advantageous in terms of ease of synthesis.

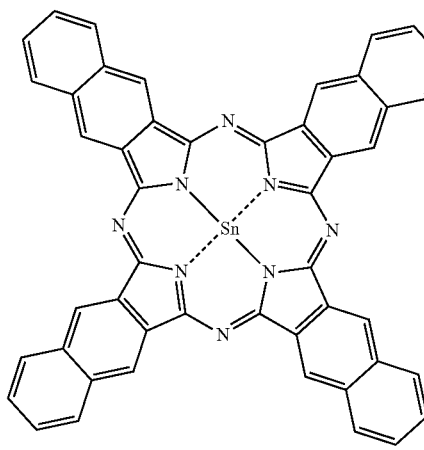

(3)

Figure 5:
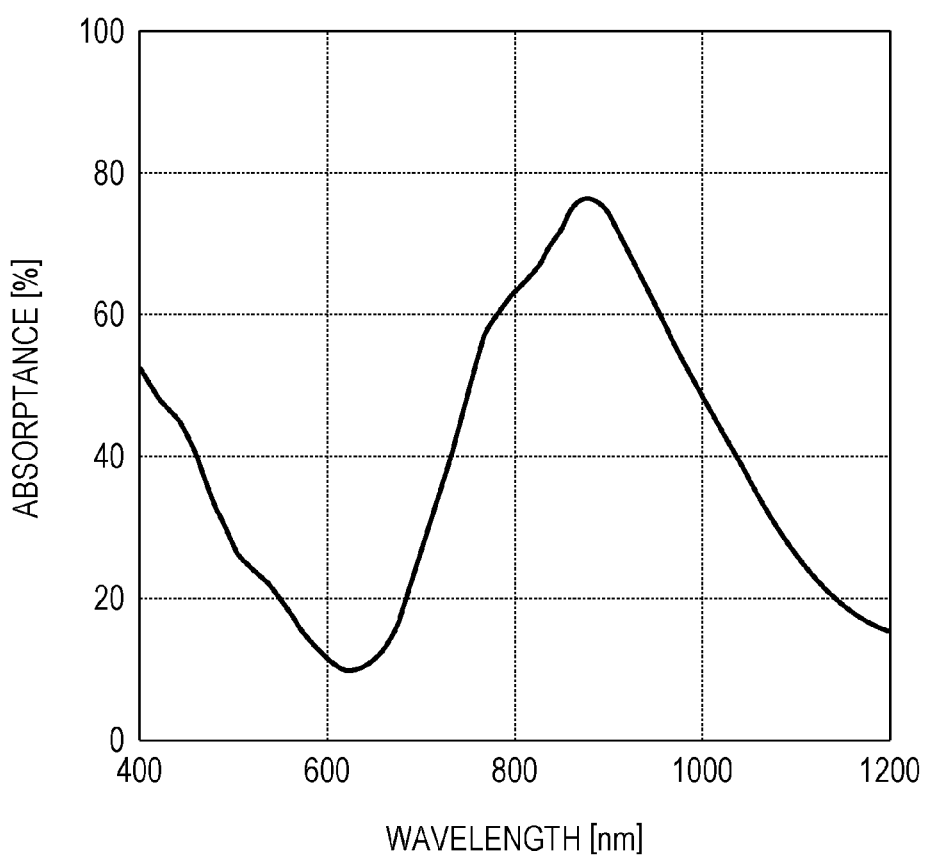
FIG. 5 is a graph showing an example of an absorption spectrum in a photoelectric conversion layer formed from a material containing tin naphthalocyanine.

The tin naphthalocyanine represented by general formula (1) above exhibits absorption in the wavelength range of from about 200 nm to 1,100 nm inclusive. The absorption peak of tin naphthalocyanine can be located at a wavelength of about 940 nm. The tin naphthalocyanine represented by formula (3) above has an absorption peak at a wavelength of about 870 nm as shown in FIG. 5. FIG. 5 is an example of the absorption spectrum in a photoelectric conversion layer containing the tin naphthalocyanine represented by formula (3) above. The quantum efficiency of the photoelectric conversion layer containing the tin naphthalocyanine represented by formula (3) at a wavelength of 900 nm can be about 10 times higher than that of silicon. In the measurement of the absorption spectrum, a sample in which the photoelectric conversion layer (thickness: 30 nm) was stacked on a quartz substrate was used.

As can be seen from FIG. 5, the photoelectric conversion layer formed from a material containing the tin naphthalocyanine exhibits absorption in the near infrared region. Specifically, by selecting the material containing the tin naphthalocyanine as the material forming the photoelectric conversion layer 23A, a photosensor capable of detecting near infrared rays can be obtained. In this embodiment of the present disclosure, by using an appropriate material suitable for an intended detection wavelength range, a photosensor having sensitivity in the desired wavelength range can be obtained. For example, P3HT (poly(3-hexylthiophene-2,5-diyl)), which is an example of an organic p-type semiconductor compound, has an absorption peak at a wavelength of 550 nm, and copper phthalocyanine has absorption peaks at wavelengths of 620 nm and 700 nm.

No particular limitation is imposed on the material for forming the photoelectric conversion layer 23A so long as the material can generate electric charges by absorption of light. The photoelectric conversion layer 23A may be formed from an organic p-type semiconductor (compound) described later or may be formed from an organic n-type semiconductor (compound) described later. Alternatively, a combination of an organic p-type semiconductor (compound) and an organic n-type semiconductor (compound) may be used to form the photoelectric conversion layer 23A. The photoelectric conversion layer 23A may contain an inorganic semiconductor material such as amorphous silicon. The photoelectric conversion layer 23A may include a layer formed from an organic material and a layer formed from an inorganic material.

Figure 6:
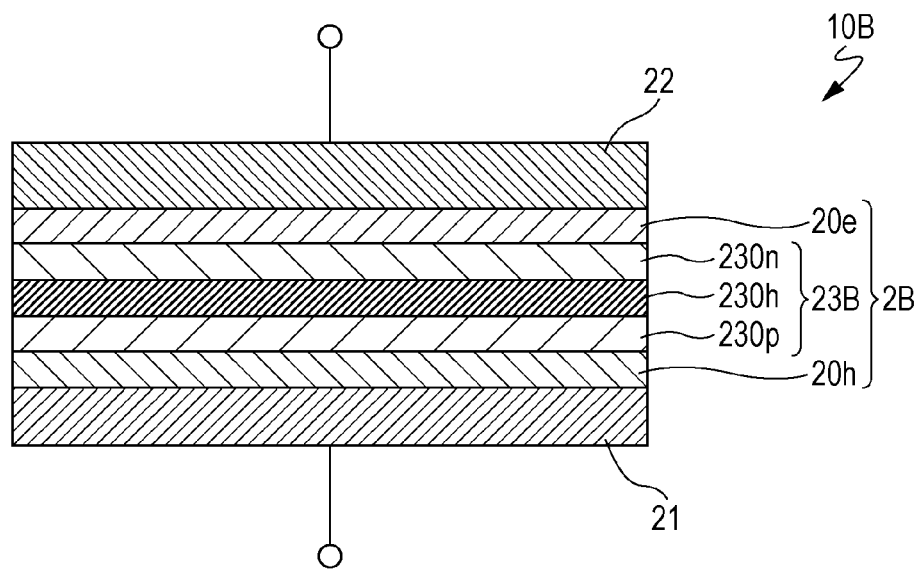
FIG. 6 is a schematic cross-sectional view showing an example of the structure of a photodetection element including a photoelectric conversion layer formed using an organic semiconductor material containing tin naphthalocyanine represented by general formula (1)

FIG. 6 shows an example of the structure of a photodetection element including a photoelectric conversion layer formed using an organic semiconductor material containing the tin naphthalocyanine represented by general formula (1) above. A dielectric structure 2B in the photodetection element 10B shown in FIG. 6 includes a hole blocking layer 20$h$, a photoelectric conversion layer 23B, and an electron blocking layer 20$e$. In the structure exemplified in FIG. 6, the hole blocking layer 20$h$ is disposed between a first electrode 21 and the photoelectric conversion layer 23B, and the electron blocking layer 20$e$ is disposed between the photoelectric conversion layer 23B and a second electrode 22.

The photoelectric conversion layer 23B contains at least one of a p-type semiconductor and an n-type semiconductor. In the structure exemplified in FIG. 6, the photoelectric conversion layer 23B includes a p-type semiconductor layer 230$p$, an n-type semiconductor layer 230$n$, and a mixed layer 230$h$ sandwiched between the p-type semiconductor layer 230$p$ and the n-type semiconductor layer 230$n$. The p-type semiconductor layer 230$p$ is disposed between the hole blocking layer 20$h$ and the mixed layer 230$h$ and functions as a photoelectric conversion layer and/or a hole transport layer. The n-type semiconductor layer 230$n$ is disposed between the mixed layer 230$h$ and the electron blocking layer 20$e$ and functions as a photoelectric conversion layer and/or an electron transport layer. As described later, the mixed layer 230$h$ contains a p-type semiconductor and an n-type semiconductor.

The p-type semiconductor layer 230$p$ and the n-type semiconductor layer 230$n$ contain an organic p-type semiconductor and an organic n-type semiconductor, respectively. The photoelectric conversion layer 23B may contain an organic photoelectric conversion material containing the tin naphthalocyanine represented by general formula (1) above and at least one of an organic p-type semiconductor and an organic n-type semiconductor.

The organic p-type semiconductor (compound) is an electron-donating organic semiconductor (compound) typified mainly by a hole transport organic compound and is an organic compound having the property of easily donating electrons. More specifically, when two organic materials in contact with each other are used, one of the organic materials that has a lower ionization potential is an organic p-type semiconductor (compound). Therefore, any organic compound having the ability to donate electrons can be used as the electron-donating organic compound. Examples of the organic compound that can be used include triallylamine compounds, benzidine compounds, pyrazoline compounds, styrylamine compounds, hydrazone compounds, triphenylmethane compounds, carbazole compounds, polysilane compounds, thiophene compounds such as P3HT, phthalocyanine compounds such as copper phthalocyanine, cyanine compounds, merocyanine compounds, oxonol compounds, polyamine compounds, indole compounds, pyrrole compounds, pyrazole compounds, polyarylene compounds, condensed aromatic carbocyclic compounds (naphthalene derivatives, anthracene derivatives, phenanthrene derivatives, tetracene derivatives, pyrene derivatives, perylene derivatives, and fluoranthene derivatives), and metal complexes containing a nitrogen-containing heterocyclic compound as a ligand. The electron-donating organic semiconductor is not limited to these compounds, and any other organic compound that has a lower ionization potential than an organic compound used as the n-type (electron-accepting) compound can be used as the electron-donating organic semiconductor, as described above. The tin naphthalocyanine described above is an example of the organic p-type semiconductor material.

The organic n-type semiconductor (compound) is an electron-accepting organic semiconductor (compound) typified mainly by an electron transport organic compound and is an organic compound having the property of easily accepting electrons. More specifically, when two organic materials in contact with each other are used, one of the organic materials that has a higher electron affinity is an organic n-type semiconductor (compound). Therefore, any organic compound having the ability to accept electrons can be used as the electron-accepting organic compound. Examples of the organic compound that can be used include fullerenes, fullerene derivatives such as phenyl-$C_{61}$-butyric acid methyl ester (PCBM), condensed aromatic carbocyclic compounds (naphthalene derivatives, anthracene derivatives, phenanthrene derivatives, tetracene derivatives, pyrene derivatives, perylene derivatives, and fluoranthene derivatives), 5- to 7-membered nitrogen, oxygen, and/or sulfur atom-containing heterocyclic compounds (such as pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolopyridine, thiadiazolopyridine, dibenzazepine, and tribenzazepine), polyarylene compounds, fluorene compounds, cyclopentadiene compounds, silyl compounds, perylenetetracarboxylic diimide (PTCDI) compounds, and metal complexes containing a nitrogen-containing heterocyclic compound as a ligand. The electron-accepting organic semiconductor is not limited to these compounds, and any other organic compound that has a higher electron affinity than an organic compound used as the p-type (electron-donating) compound can be used as the electron-accepting organic semiconductor, as described above.

When the dielectric structure 2B has the photoelectric conversion layer 23B including the p-type semiconductor layer 230$p$ and the n-type semiconductor layer 230$n$ as exemplified in FIG. 6, holes and electrons generated by photoelectric conversion can be easily separated from each other. Therefore, when the photoelectric conversion layer 23B including the p-type semiconductor layer 230$p$ and the n-type semiconductor layer 230$n$ is used, the efficiency of charge separation is improved, and a change in the intensity of incident light can cause a larger change in permittivity.

The mixed layer 230$h$ may be, for example, a bulk heterojunction structure layer containing a p-type semiconductor and an n-type semiconductor. When the mixed layer 230$h$ is formed as a layer having the bulk heterojunction structure, the tin naphthalocyanine represented by general formula (1) above may be used as the p-type semiconductor material. The n-type semiconductor material used may be a fullerene and/or a fullerene derivative. The details of the bulk heterojunction structure are described in Japanese Patent No. 5553727. The entire disclosure of Japanese Patent No. 5553727 is incorporated herein for reference purposes.

(Hole Blocking Layer)

The material used to form the hole blocking layer 20$h$ may be an n-type semiconductor or an electron transport organic compound. Examples of such materials include: organic materials and organic-metal compounds such as fullerenes, e.g., $C_{60}$ and $C_{70}$, fullerene derivatives, e.g., indene-$C_{60}$ bisadduct (ICBA), carbon nanotubes and derivatives thereof, oxadiazole derivatives, e.g., OXD-7 (1,3-bis(4-tert-butylphenyl-1,3,4-oxadiazolyl)phenylene), anthraquinodimethane derivatives, diphenylquinone derivatives, bathocuproine (BCP), bathophenanthroline and derivatives thereof, distyrylarylene derivatives, triazole compounds, silole compounds, a tris(8-hydroxyquinolinato)aluminum complex, a bis(4-methyl-8-quinolinato)aluminum complex, acetylacetonate complexes, copper phthalocyanine, 3,4,9,10-perylenetetracarboxylic dianhydride (PTCDA), and Alq; and inorganic materials such as MgAg and MgO. The material used to form the hole blocking layer 20$h$ may be selected from the above materials in consideration of the ionization potential of the material forming the photoelectric conversion layer 23A (or the p-type semiconductor layer 230$p$ in the photoelectric conversion layer 23B).

In a structure in which light enters the photoelectric conversion layer 23B (or the photoelectric conversion layer 23A) from the first electrode 21 side, it is beneficial when the transmittance of the hole blocking layer 20$h$ in the intended detection wavelength range is high. For example, the hole blocking layer 20$h$ may be reduced in thickness. The hole blocking layer 20$h$ may have a thickness within the range of, for example, from 5 nm to 50 nm inclusive.

(Electron Blocking Layer)

The material used to form the electron blocking layer 20$e$ may be a p-type semiconductor or a hole transport organic compound. Examples of such materials include aromatic diamine compounds such as TPD (N,N'-bis(3-methylphenyl)-(1,1'-biphenyl)-4,4'-diamine) and α-NPD (4,4'-bis[N-(naphthyl)-N-phenyl-amino]biphenyl), oxazole, oxadiazole, triazole, imidazole, imidazolone, stilbene derivatives, pyrazoline derivatives, tetrahydroimidazole, polyarylalkanes, butadiene, m-MTDATA (4,4',4"-tris(N-(3-methylphenyl)N-phenylamino)triphenylamine), perylene, porphyrin compounds such as porphine, copper tetraphenylporphine, phthalocyanine, copper phthalocyanine, and titanium phthalocyanine oxide, triazole derivatives, oxadiazole derivatives, imidazole derivatives, polyarylalkane derivatives, pyrazoline derivatives, pyrazolone derivatives, phenylenediamine derivatives, allylamine derivatives, amino-substituted chalcone derivatives, oxazole derivatives, styrylanthracene derivatives, fluorenone derivatives, hydrazone derivatives, and silazane derivatives. The material used to form the electron blocking layer 20$e$ may be: polymers of phenylenevinylene, fluorene, carbazole, indole, pyrene, pyrrole, picoline, thiophene, acetylene, and diacetylene; and derivatives thereof. The material used to form the electron blocking layer 20$e$ is selected from the above materials in consideration of the electron affinity of the photoelectric conversion layer 23A (or the n-type semiconductor layer 230$n$ in the photoelectric conversion layer 23B).

In a structure in which light enters the photoelectric conversion layer 23B (or the photoelectric conversion layer 23A) from the second electrode 22 side, it is beneficial when the transmittance of the electron blocking layer 20$e$ in the intended detection wavelength range is high. For example, the electron blocking layer 20$e$ may be reduced in thickness. The electron blocking layer 20$e$ may have a thickness within the range of, for example, from 5 nm to 50 nm inclusive.

(Other Structural Examples of Photodetection Element)

By selecting an appropriate combination of the materials of the first electrode 21, the photoelectric conversion layer (the photoelectric conversion layer 23A or 23B), and the second electrode 22, one of the hole blocking layer 20$h$ and the electron blocking layer 20$e$ can be omitted. Examples of such a structure will next be described.

Figure 7:
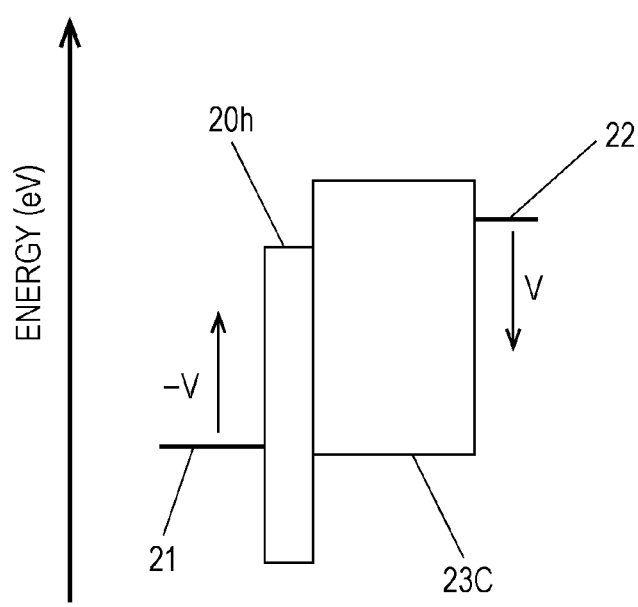
FIG. 7 is an exemplary energy diagram of a photodetection element in which a hole blocking layer and a photoelectric conversion layer are disposed between a first electrode and a second electrode.

FIG. 7 is an exemplary energy diagram of a photodetection element in which the hole blocking layer 20$h$ and a photoelectric conversion layer 23C are disposed between the first electrode 21 and the second electrode 22. As illustrated, in this example, the photoelectric conversion layer 23C is adjacent to the second electrode 22 to which the second voltage is applied. Specifically, FIG. 7 shows a structural example in which the electron blocking layer 20$e$ is omitted. In the example described here, the photoelectric conversion layer 23C has a heterojunction structure between the p-type semiconductor layer 230$p$ and the n-type semiconductor layer 230$n$. Of course, the photoelectric conversion layer 23C may have a bulk heterojunction structure.

In the structure exemplified in FIG. 7, as in the photodetection element 10A described with reference to FIGS. 2 and 3, the hole blocking layer 20$h$ suppresses movement of holes from the photoelectric conversion layer 23C to the first electrode 21. In the structure exemplified in FIG. 7, the difference between the LUMO of the hole blocking layer 20$h$ and the Fermi level of the first electrode 21 is large, and therefore a potential barrier for electrons is formed between the first electrode 21 and the hole blocking layer 20$h$. The potential barrier suppresses movement of electrons from the first electrode 21 to the hole blocking layer 20$h$. In other words, transport of electrons from the first electrode 21 to the hole blocking layer 20$h$ is suppressed without using an electron blocking layer.

In the structure in which the photoelectric conversion layer (the photoelectric conversion layer 23C in this case) and an electrode (the second electrode 22 in this case) are disposed adjacent to each other, it is known that, when the difference between the work function of the electrode and the ionization potential of the organic film adjacent to the electrode is large, holes are unlikely to enter the organic film from the electrode. In the structure exemplified in FIG. 7, the ionization potential of the photoelectric conversion layer 23C is higher than the work function of the second electrode 22, and the difference between the HOMO of the photoelectric conversion layer 23C and the Fermi level of the second electrode 22 is relatively large. Therefore, the potential barrier between the photoelectric conversion layer 23C and the second electrode 22 suppresses injection of holes from the second electrode 22 into the photoelectric conversion layer 23C.

As described above, also by suppressing movement of positive charges or negative charges (holes in this case) generated by photoelectric conversion to an electrode (the first electrode 21 in this case), the charges generated by photoelectric conversion can be retained within the photoelectric conversion layer 23C. Specifically, even though the electron blocking layer 20$e$ is not provided, the permittivity can be changed in response to irradiation with light when the materials of the first electrode 21, the hole blocking layer 20$h$, the photoelectric conversion layer 23C, and the second electrode 22 are appropriately selected such that the relative relations among the energies of the components of the photodetection element are as shown in FIG. 7.

One example of the combination of the materials that can satisfy the relative relations among the energies of the components of the photodetection element in FIG. 7 is as follows.

First electrode 21: ITO (WF: 4.7 eV)
Hole blocking layer 20$h$: ICBA (IP: 6.5 eV, EA: 3.7 eV)
p-Type semiconductor layer 230$p$: copper phthalocyanine (IP: 5.2 eV, EA: 3.5 eV)
n-Type semiconductor layer 230$n$: $C_{60}$ (IP: 6.2 eV, EA: 4.5 eV)

Second electrode 22: Al (WF: 4.2 eV)

Figure 8:
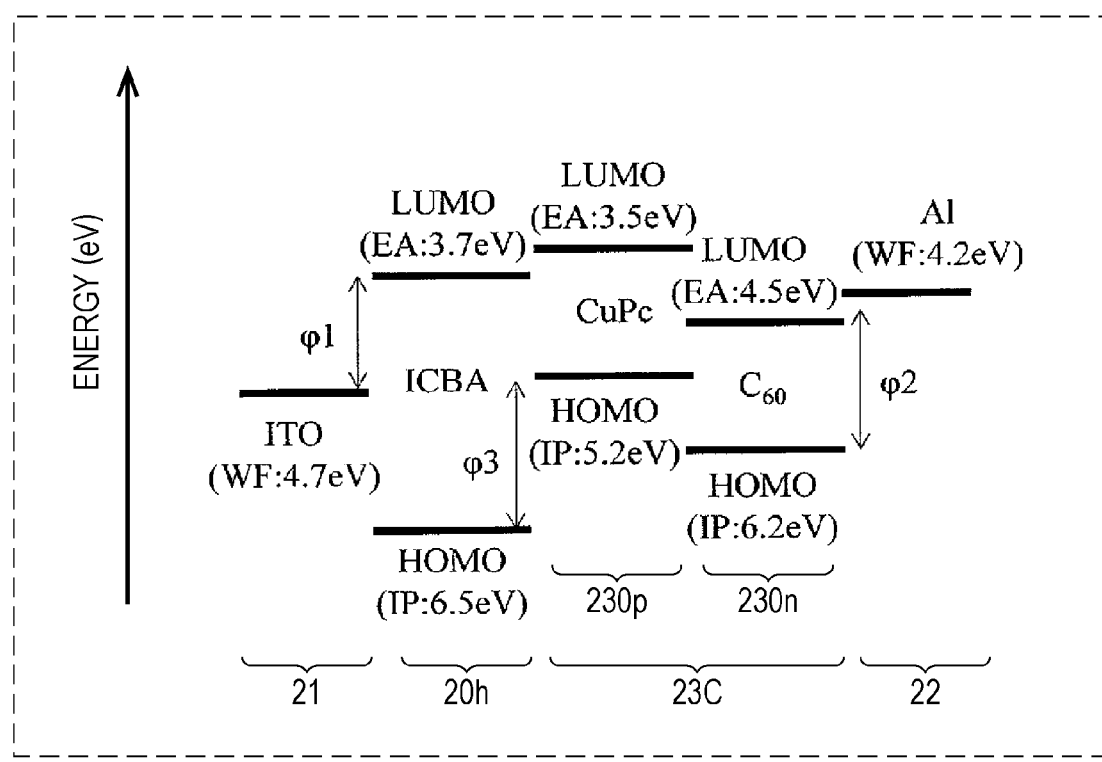
FIG. 8 is an energy diagram showing an example of the relative relations among the energies of the components of the photodetection element including the hole blocking layer disposed between the first electrode and the photoelectric conversion layer.

FIG. 8 schematically shows the relative relations among the energies obtained by the above combination. In FIG. 8, an arrow φ1 represents a potential barrier for electrons between the hole blocking layer 20h and the first electrode 21, and an arrow φ2 represents a potential barrier for holes between the n-type semiconductor layer 230n and the second electrode 22. An arrow φ3 represents a potential barrier for holes between the p-type semiconductor layer 230p and the hole blocking layer 20h. Of course, the above combination is merely an example. For example, P3HT, tin naphthalocyanine, etc. may be used instead of copper phthalocyanine exemplified as the material of the p-type semiconductor layer 230p.

Figure 9:
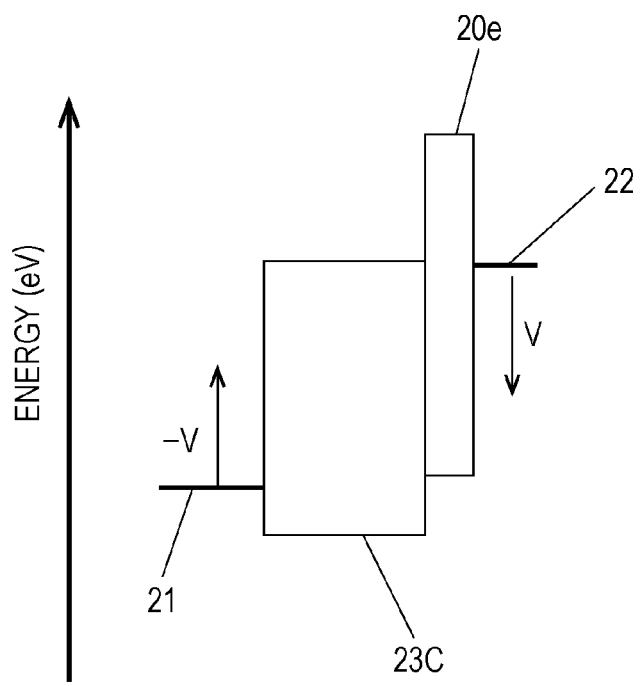
FIG. 9 is an exemplary energy diagram of a photodetection element in which the photoelectric conversion layer and an electron blocking layer are disposed between the first electrode and the second electrode.

FIG. 9 is an exemplary energy diagram of a photodetection element in which the photoelectric conversion layer 23C and the electron blocking layer 20e are disposed between the first electrode 21 and the second electrode 22. As illustrated, in this example, the photoelectric conversion layer 23C is adjacent to the first electrode 21 to which the first voltage is applied. Specifically, FIG. 9 shows a structural example in which the hole blocking layer 20h is omitted.

In the example illustrated, as in the photodetection element 10A described with reference to FIGS. 2 and 3, the electron blocking layer 20e suppresses movement of electrons from the photoelectric conversion layer 23C to the second electrode 22. In the structure exemplified in FIG. 9, the difference between the HOMO of the electron blocking layer 20e and the Fermi level of the second electrode 22 is large, and a potential barrier for holes is formed between the electron blocking layer 20e and the second electrode 22. This potential barrier suppresses movement of holes from the second electrode 22 to the electron blocking layer 20e. In other words, transport of holes from the second electrode 22 to the electron blocking layer 20e is suppressed without using a hole blocking layer.

In the structure in which the photoelectric conversion layer (the photoelectric conversion layer 23C in this case) and an electrode (the first electrode 21 in this case) are disposed adjacent to each other, when the difference between the work function of the electrode and the electron affinity of the organic film adjacent to the electrode is large, electrons are unlikely to be injected into the organic film from the electrode. In the structure exemplified in FIG. 9, the electron affinity of the photoelectric conversion layer 23C is lower than the work function of the first electrode 21, and the difference between the Fermi level of the first electrode 21 and the LUMO of the photoelectric conversion layer 23C is relatively large. Therefore, a potential barrier is formed between the first electrode 21 and the photoelectric conversion layer 23C. This potential barrier suppresses injection of electrons from the first electrode 21 into the photoelectric conversion layer 23C. As described above, even though the hole blocking layer 20h is not provided, the permittivity can be changed in response to irradiation with light when the materials of the first electrode 21, the photoelectric conversion layer 23C, the electron blocking layer 20e, and the second electrode 22 are appropriately selected such that the relative relations among the energies of the components of the photodetection element are as shown in FIG. 9.

One example of the combination of the materials of the first electrode 21, the photoelectric conversion layer 23C, the electron blocking layer 20e, and the second electrode 22 that are combined so as to satisfy the relative relations among the energies of the components of the photodetection element in FIG. 9 is as follows.

First electrode 21: ITO (WF: 4.7 eV)
p-Type semiconductor layer 230p: copper phthalocyanine (IP: 5.2 eV, EA: 3.5 eV)
n-Type semiconductor layer 230n: $C_{60}$ (IP: 6.2 eV, EA: 4.5 eV)
Electron blocking layer 20e: perylene (IP: 5.3 eV, EA: 2.3 eV)
Second electrode 22: Al (WF: 4.2 eV)

Figure 10:
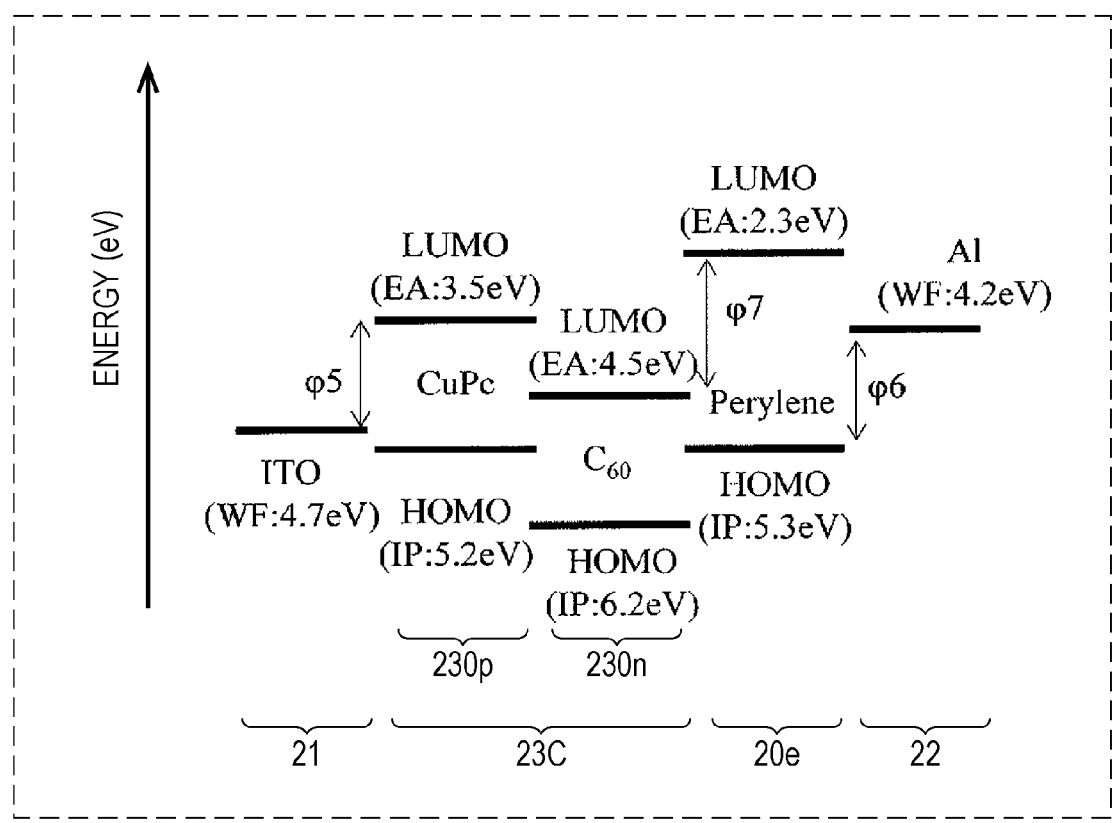
FIG. 10 is an energy diagram showing an example of the relative relations among the energies of the components of the photodetection element including the electron blocking layer disposed between the photoelectric conversion layer and the second electrode.

FIG. 10 schematically shows the relative relations among the energies obtained by the above combination. In FIG. 10, an arrow φ5 represents a potential barrier for electrons between the first electrode 21 and the p-type semiconductor layer 230p. An arrow φ6 represents a potential barrier for holes between the electron blocking layer 20e and the second electrode 22, and an arrow φ7 represents a potential barrier for electrons between the n-type semiconductor layer 230n and the electron blocking layer 20e. P3HT, tin naphthalocyanine, etc. may be used instead of copper phthalocyanine exemplified as the material of the p-type semiconductor layer 230p. Copper phthalocyanine may be used instead of perylene exemplified as the material of the electron blocking layer 20e.

As described above, the photodetection element in which the hole blocking layer 20h or the electron blocking layer 20e is omitted can also suppress movement of electric charges generated by photoelectric conversion to the electrodes. In other words, the same effects as those of the photodetection element having both the hole blocking layer 20h and the electron blocking layer 20e can be obtained using the simpler structures. It should be noted that, in the photodetection element in which one of the hole blocking layer 20h and the electron blocking layer 20e is disposed in the dielectric structure, the position of the interposed blocking layer (the hole blocking layer 20h or the electron blocking layer 20e) is determined according to which of the two electrodes is at a higher electric potential under the application of voltage.

(Second Embodiment of Photosensor)

In terms of suppressing movement of electric charges generated by photoelectric conversion to the electrodes, an insulating layer that does not allow holes and electron to pass through may be used instead of the hole blocking layer 20h and/or the electron blocking layer 20e. A description will be given of an example of the structure in which an insulating layer is disposed between a photoelectric conversion layer and electrodes.

Figure 11:
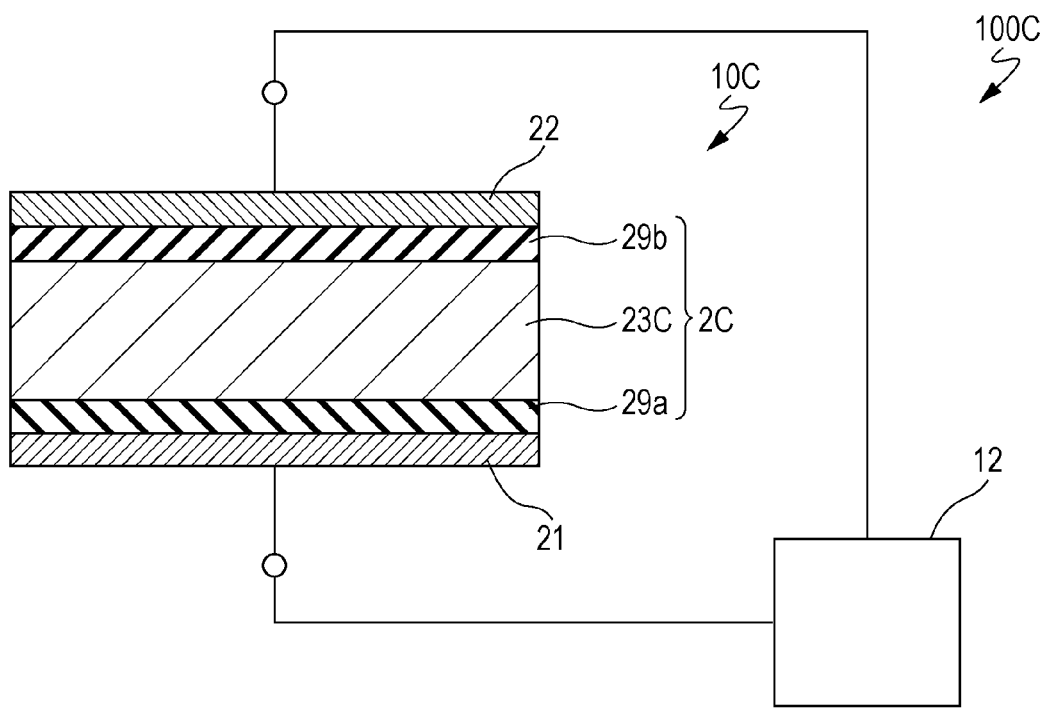
FIG. 11 is a schematic diagram showing an exemplary structure of a photosensor according to a second embodiment of the present disclosure.

FIG. 11 shows the outline of an exemplary structure of a photosensor according to a second embodiment of the present disclosure. The photosensor 100C shown in FIG. 11 includes: a photodetection element 100 including a dielectric structure 2C disposed between a first electrode 21 and a second electrode 22; and a voltage supply circuit 12. The dielectric structure 2C includes an insulating layer 29a and an insulating layer 29b. As illustrated, the insulating layer 29a is disposed between the first electrode 21 and the photoelectric conversion layer 23C. The insulating layer 29b is disposed between the photoelectric conversion layer 23C and the second electrode 22.

Figure 12:
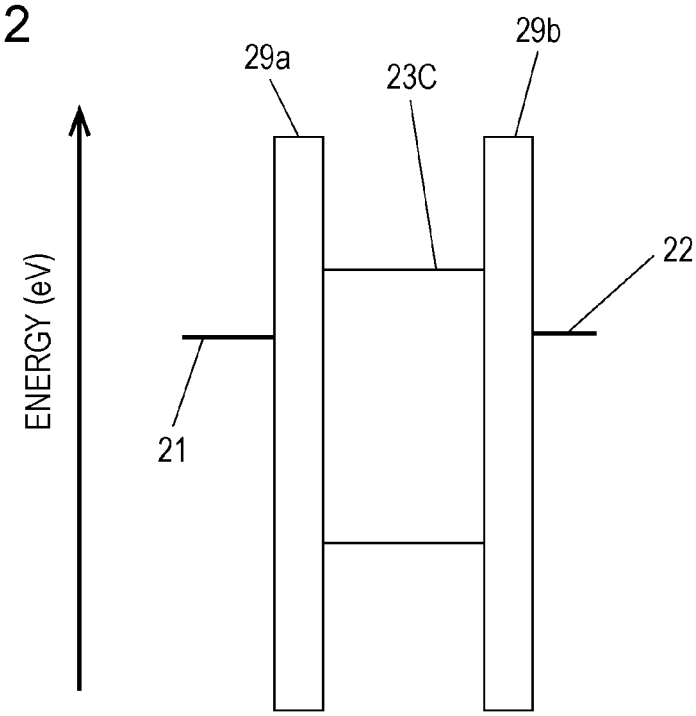
FIG. 12 is an exemplary energy diagram of a photodetection element shown in FIG. 11.

FIG. 12 is an exemplary energy diagram of the photodetection element 100. In FIG. 12, the base of the leftmost one of three rectangles represents the upper edge of the valence band of the insulating layer 29a, and the side opposite to the base represents the bottom of its conduction band. Similarly, the rightmost rectangle in FIG. 12 schematically shows the energy levels of the upper edge of the valence band of the insulating layer 29b and the bottom of its conduction band. In the following description, the difference between the upper edge of a valence band and the vacuum level and the difference between the bottom of a conduction band and the vacuum level may be represented by VB and CB, respectively.

By disposing the insulating layer 29a between the first electrode 21 and the photoelectric conversion layer 23C, movement of electric charges between the first electrode 21 and the photoelectric conversion layer 23C can be suppressed even when a voltage is applied between the first electrode 21 and the second electrode 22. By disposing the insulating layer 29b between the second electrode 22 and the photoelectric conversion layer 23C, movement of electric charges between the second electrode 22 and the photoelectric conversion layer 23C can be suppressed. Therefore, the electric charges generated by photoelectric conversion are suppressed from migrating to the electrodes (the first electrode 21 and/or the second electrode 22) and can be used as electric charges contributing to a change in the permittivity of the dielectric structure 2C. The "insulating layers" as used herein are distinguished from the hole blocking layer 20h and the electron blocking layer 20e because the insulating layers block the movement of both the positive and negative charges irrespective of the direction of the electric field applied from the outside. In other words, the "insulating layers" as used herein suppress both the positive and negative charges from migrating from the electrodes to the photoelectric conversion layer and from migrating from the photoelectric conversion layer to the electrodes.

The material used to form the insulating layers 29a and 29b may be, for example, an oxide such as $SiO_2$, $Al_2O_3$, $ZrO_2$, $HfO_2$, or $Y_2O_3$ or a resin such as polymethyl methacrylate (PMMA), polyimide, parylene (registered trademark), or polystyrene. The same material may be used to form the insulating layers 29a and 29b, or different materials may be used. A silicon oxynitride film (SiON film) generally used for silicon semiconductors may be used for the insulating layer 29a and/or the insulating layer 29b. It is beneficial that a so-called high-permittivity material (referred to also as a high-k material and having a relative permittivity of typically more than 3.9) is used to form the insulating layer 29a and/or the insulating layer 29b. The thicknesses of the insulating layer 29a and the insulating layer 29b may be appropriately set according to the electric conductivities of the insulating layer 29a and the insulating layer 29b.

In the structure exemplified in FIGS. 11 and 12, the insulating layer 29a is disposed between the first electrode 21 and the photoelectric conversion layer 23C. Moreover, the insulating layer 29b is disposed between the photoelectric conversion layer 23C and the second electrode 22. Therefore, during operation of the photosensor 100C, any one of the first electrode 21 and the second electrode 22 may be at a higher potential than the other. Specifically, the structure exemplified in FIG. 11 has an advantage in that less restrictions are imposed on the material of the first electrode 21 and the material of the second electrode 22. For example, when the second electrode 22 is a transparent electrode, the material used for the second electrode 22 may be a transparent conductive oxide (TCO) such as ITO, IZO, AZO, FTO, $SnO_2$, $TiO_2$, or $ZnO_2$, a carbon nanotube, graphene, etc. When the first electrode 21 is a transparent electrode, the material used for the second electrode 22 may be Al, TiN, Cu, TaN, etc. The material used for the first electrode 21 may be selected from the same materials as those for the second electrode 22. For example, the material used for the first electrode 21 may be Al, TiN, Cu, TaN, ITO, etc.

(Other Structural Examples of Photodetection Element)

As described below, one of the insulating layers 29a and 29b can be omitted by selecting an appropriate combination of the materials of the first electrode 21, the photoelectric conversion layer 23C (or the photoelectric conversion layer 23A or 23B), and the second electrode 22.

Figure 13:
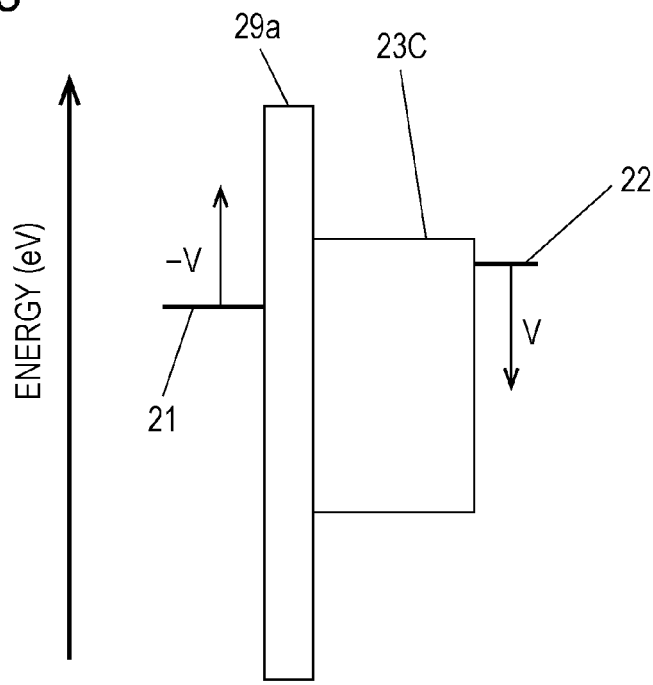
FIG. 13 is an exemplary energy diagram of a photodetection element in which an insulating layer and a photoelectric conversion layer are disposed between a first electrode and a second electrode.

FIG. 13 is an exemplary energy diagram of a photodetection element in which the insulating layer 29a and the photoelectric conversion layer 23C are disposed between the first electrode 21 and the second electrode 22. As illustrated, in this example, the photoelectric conversion layer 23C is adjacent to the second electrode 22 to which the second voltage is applied. Specifically, FIG. 13 shows a structural example in which the insulating layer 29b is omitted.

In the structure exemplified in FIG. 13, the insulating layer 29a suppresses movement of holes from the photoelectric conversion layer 23C to the first electrode 21 and movement of electrons from the first electrode 21 to the photoelectric conversion layer 23C. In this example, the ionization potential of the photoelectric conversion layer 23C is set to be larger than the work function of the second electrode 22. Therefore, injection of holes from the second electrode 22 into the photoelectric conversion layer 23C is suppressed by the potential barrier between the photoelectric conversion layer 23C and the second electrode 22. In this case, part of electric charges (e.g., holes) generated by photoelectric conversion can be retained within the photoelectric conversion layer 23C and can be utilized as electric charges contributing to a change in the permittivity of the photoelectric conversion layer 23C. As described above, even though the insulating layer 29b is not provided between the photoelectric conversion layer 23C and the second electrode 22, movement of electric charges generated by photoelectric conversion to the electrodes can be suppressed by appropriately selecting the materials of the first electrode 21, the insulating layer 29a, the photoelectric conversion layer 23C, and the second electrode 22 such that the relative relations among the energies of the components of the photodetection element are as shown in FIG. 13.

One example of the combination of the materials that can satisfy the relative relations among the energies of the components of the photodetection element in FIG. 13 is as follows.

First electrode 21: ITO (WF: 4.7 eV)

Insulating layer 29a: $Al_2O_3$ (VB: 10.0 eV, CB: 1.2 eV)

p-Type semiconductor layer 230p: copper phthalocyanine (IP: 5.2 eV, EA: 3.5 eV)

n-Type semiconductor layer 230n: $C_{60}$ (IP: 6.2 eV, EA: 4.5 eV)

Second electrode 22: Al (WF: 4.2 eV)

Figure 14:
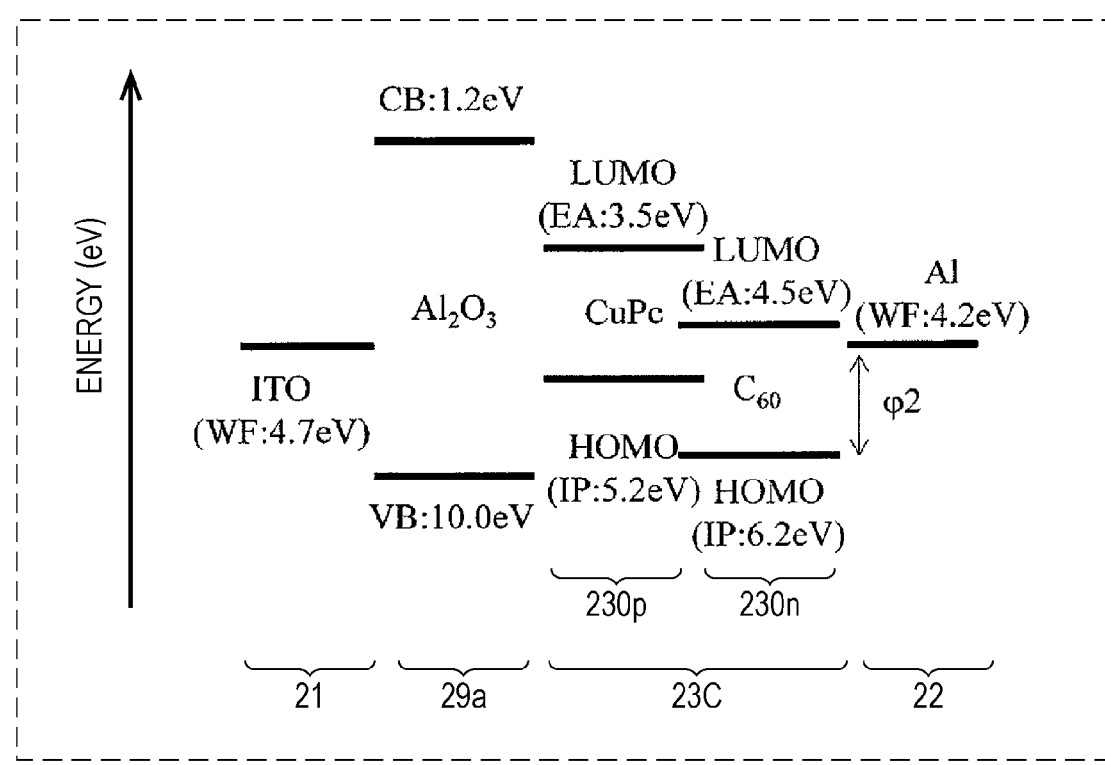
FIG. 14 is an energy diagram showing an example of the relative relations among the energies of the components of the photodetection element including the insulating layer disposed between the first electrode and the photoelectric conversion layer.

FIG. 14 schematically shows the relative relations among the energies obtained by the above combination. The material used for the second electrode 22 may be a metal having a work function of from about 4.1 eV to about 4.3 eV inclusive. Therefore, instead of Al exemplified as the material of the second electrode 22, Ti, Ta, Ag, etc. may be used. The material used for the n-type semiconductor layer 230n adjacent to the second electrode 22 may be a material having an ionization potential of about 5 eV or more. Instead of $Al_2O_3$ exemplified as the material of the insulating layer 29a, $SiO_2$, $ZrO_2$, $HfO_2$, $Y_2O_3$, etc. may be used.

Figure 15:
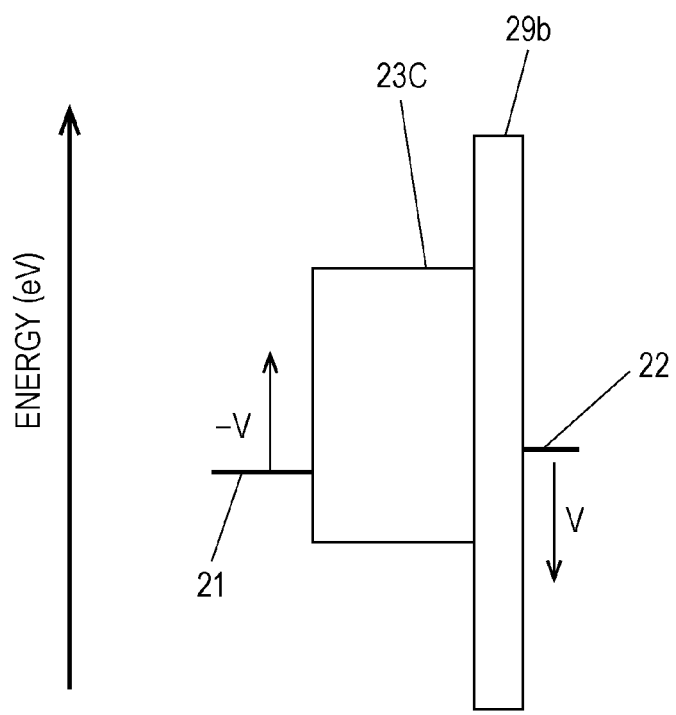
FIG. 15 is an exemplary energy diagram of a photodetection element in which the photoelectric conversion layer and an insulating layer are disposed between the first electrode and the second electrode.

FIG. 15 is an exemplary energy diagram of a photodetection element in which the photoelectric conversion layer 23C and the insulating layer 29b are disposed between the first electrode 21 and the second electrode 22. As illustrated, in this example, the photoelectric conversion layer 23C is adjacent to the first electrode 21 to which the first voltage is applied. Specifically, FIG. 15 shows an example in which the insulating layer 29a is omitted.

In the structure exemplified in FIG. 15, the insulating layer 29b blocks movement of electrons from the photoelectric conversion layer 23C to the second electrode 22 and movement of holes from the second electrode 22 to the photoelectric conversion layer 23C. In this example, the electron affinity of the photoelectric conversion layer 23C is set to be lower than the work function of the first electrode 21. In this case, injection of electrons from the first electrode 21 into the photoelectric conversion layer 23C is suppressed by the potential barrier between the first electrode 21 and the photoelectric conversion layer 23C. Therefore, also in the above structure, part of electric charges (e.g., electrons) generated by photoelectric conversion can be retained within the photoelectric conversion layer 23C and can be used as electric charges contributing to a change in the permittivity of the photoelectric conversion layer 23C. As described above, even though the insulating layer 29a is not provided between the first electrode 21 and the photoelectric conversion layer 23C, movement of electric charges generated by photoelectric conversion to the electrodes can be suppressed by appropriately selecting the materials of the first electrode 21, the photoelectric conversion layer 23C, the insulating layer 29b, and the second electrode 22 such that the relative relations among the energies of the components of the photodetection element are as shown in FIG. 15.

One example of the combination of the materials that can satisfy the relative relations among the energies of the components of the photodetection element in FIG. 15 is as follows.

First electrode 21: Au (WF: 4.9 eV)
p-Type semiconductor layer 230p: copper phthalocyanine (IP: 5.2 eV, EA: 3.5 eV)
n-Type semiconductor layer 230n: $C_{60}$ (IP: 6.2 eV, EA: 4.5 eV)
Insulating layer 29b: $Al_2O_3$ (VB: 10.0 eV, CB: 1.2 eV)
Second electrode 22: ITO (WF: 4.7 eV)

Figure 16:
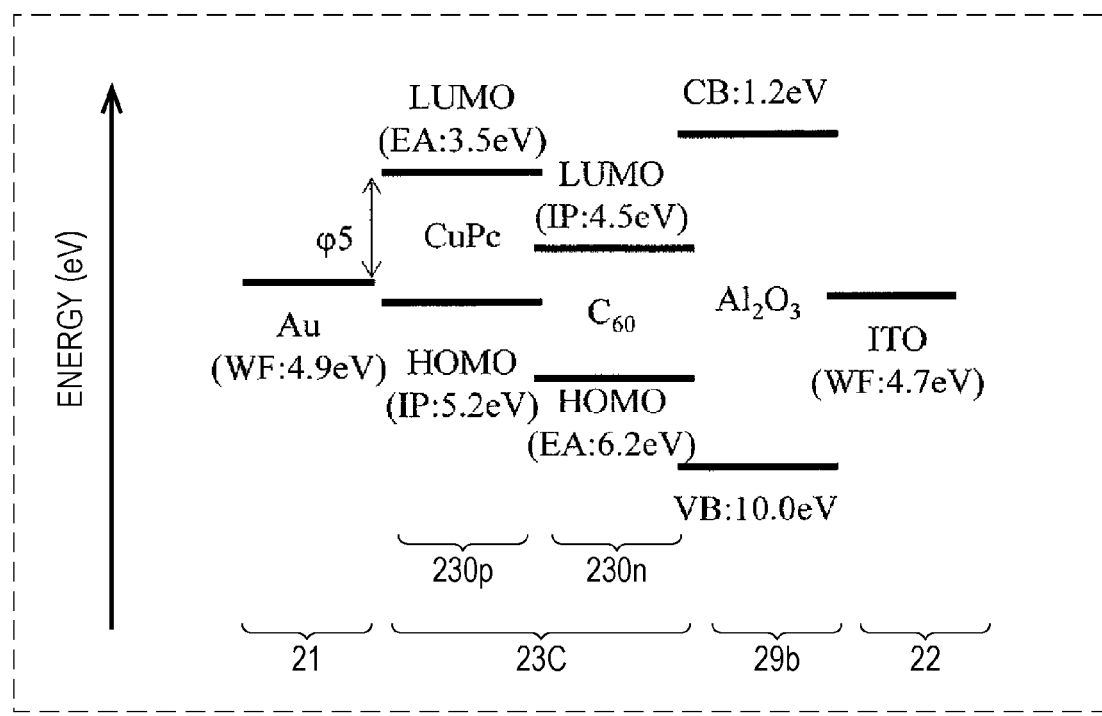
FIG. 16 is an energy diagram showing an example of the relative relations among the energies of the components of the photodetection element including the insulating layer disposed between the photoelectric conversion layer and the second electrode.

FIG. 16 schematically shows the relative relations among the energies obtained by the above combination. The material used for the first electrode 21 may be a metal having a work function of about 4.8 eV or more. For example, instead of Au exemplified as the material of the first electrode 21, Pt, Ni, ITO, etc. may be used.

Examples

Figure 17:
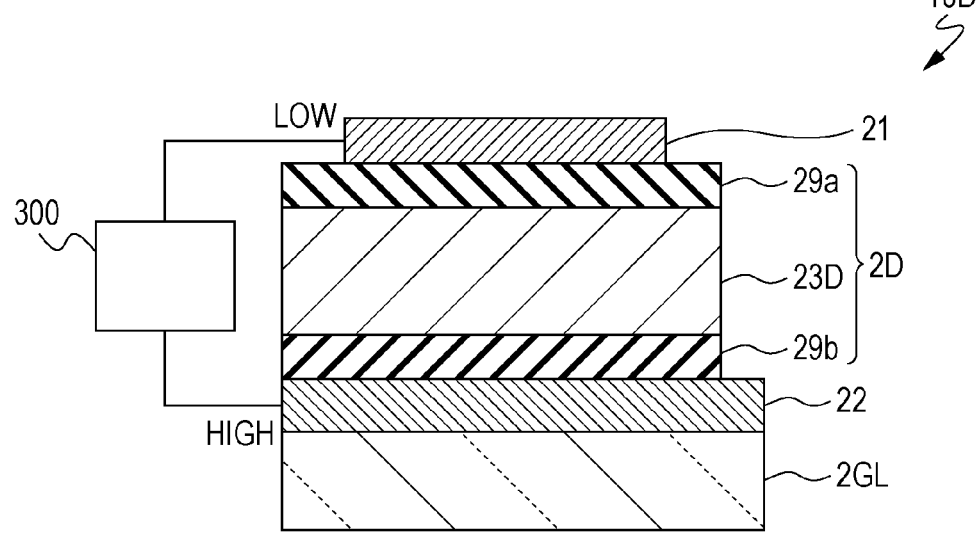
FIG. 17 is a schematic diagram showing the structure of a photodetection element used to measure a change in permittivity.

An example of the change in the permittivity of a photoelectric conversion layer due to light irradiation will be described with reference to an Example. FIG. 17 schematically shows the structure of a photodetection element used for measurement of the change in permittivity. The photodetection element 10D having the structure shown in FIG. 17 was produced using the following procedure.

First, a glass substrate 2GL was prepared. Next, ITO was deposited on the glass substrate 2GL by sputtering to thereby form an ITO electrode (thickness: 50 nm) serving as a second electrode 22. Next, atomic layer deposition (ALD) was used to form a $HfO_2$ layer (thickness: 30 nm) serving as an insulating layer 29b on the second electrode 22. Then tin naphthalocyanine and $C_{60}$ were co-evaporated to form a co-evaporated layer (thickness: 150 nm) serving as a photoelectric conversion layer 23D on the insulating layer 29b.

Next, ALD was used to form an $Al_2O_3$ layer (thickness: 30 nm) serving as an insulating layer 29a on the photoelectric conversion layer 23D. Then sputtering was used to deposit Al on the insulating layer 29a to thereby form an Al electrode (thickness: 80 nm) serving as a first electrode 21. Through the above steps, a photodetection element 10D having the structure shown in FIG. 17 was obtained. The shape of the photoelectric conversion layer 23D was a rectangle with 1 mm sides when viewed in a direction normal to the glass substrate 2GL.

In this example, an LED light source (wavelength: 940 nm, rated power consumption: about 70 mW) was used. As schematically shown in FIG. 17, a measuring apparatus 300 was connected to the first electrode 21 and the second electrode 22 to apply a potential difference of 4 V between the first electrode 21 and the second electrode 22. In this state, the capacitance value of a dielectric structure 2D between the first electrode 21 and the second electrode 22 was measured. To measure the capacitance value, a semiconductor device parameter analyzer B1500A (measurement frequency: 1 kHz, amplitude: 0.1 V) manufactured by Keysight was used. During the measurement, a LOW side of a probe of the measuring apparatus was brought into contact with the first electrode 21, and a HIGH side of the probe was brought into contact with the second electrode 22.

Figure 18:
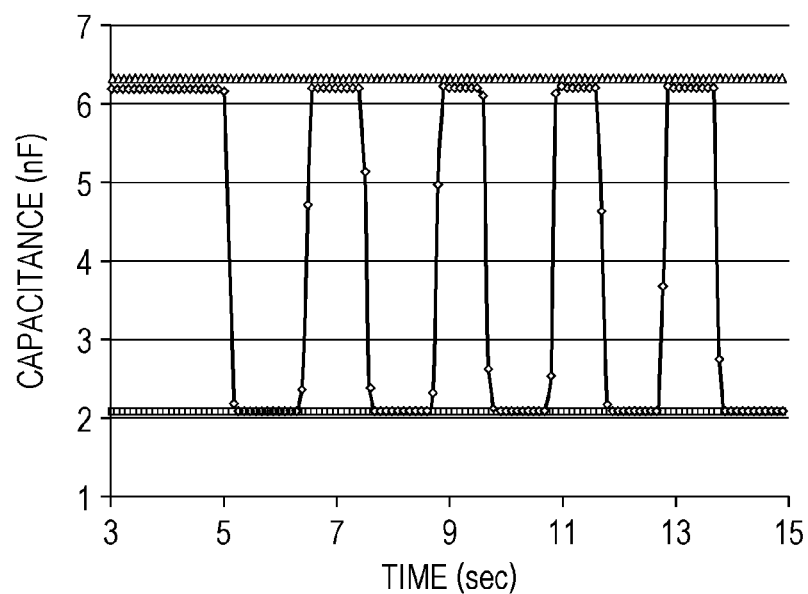
FIG. 18 is a graph showing the results of measurement of the capacitance value of a dielectric structure of the photodetection element.

FIG. 18 shows the results of the measurement of the capacitance value of the dielectric structure 2D. In FIG. 18, open squares (□) show the results of the capacitance value measurement when the photoelectric conversion layer 23D was not irradiated with light (LED light source: off, dark condition). Open triangles (Δ) show the results of the capacitance value measurement when the photoelectric conversion layer 23D was irradiated with light (LED light source: on). As shown in FIG. 18, the capacitance value without light irradiation was about 2 μF, and the capacitance value under light irradiation was about 6.3 μF. Therefore, in this example, when the photoelectric conversion layer 23D was irradiated with light, the capacitance value of the dielectric structure 2D was increased by a factor of about 3 as compared to that in the dark condition.

Changes in the capacitance value of the dielectric structure 2D were measured with a potential difference of 4 V applied between the first electrode 21 and the second electrode 22 while the LED light source was repeatedly turned on and off at one second intervals. In FIG. 18, open diamonds (◇) show the results of the capacitance value measurement when the LED light source was repeatedly turned on and off at one second intervals. As shown in FIG. 18, when light enters the photoelectric conversion layer 23D, the capacitance value of the dielectric structure 2D increases steeply. When the LED light source is turned off, the capacitance value of the dielectric structure 2D decreases steeply.

As described above, according to this embodiment of the present disclosure, a photosensor in which the capacitance value between its electrodes changes in response to a change in illuminance can be obtained.

(Specific Examples of Device Structure)

Next, referring to the drawings, a description will be given of specific examples of the device structure of the photodetection element capable of generating a signal that corresponds to a change in permittivity due to irradiation with light.

Figure 19:
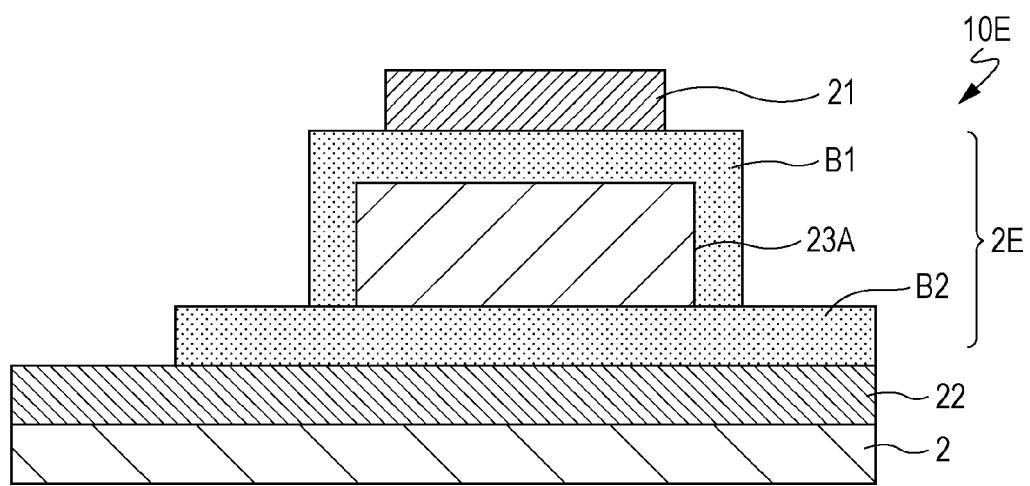
FIG. 19 is a schematic cross-sectional view showing an example of the device structure of a photodetection element.

FIG. 19 shows an example of the device structure of the photodetection element. The photodetection element 10E shown in FIG. 19 is supported by a substrate 2. The substrate 2 used may be, for example, a silicon substrate having an oxide film on its surface, a glass substrate, or a polyimide substrate. In the example illustrated, a second electrode 22 is disposed on the substrate 2.

In the structure exemplified in FIG. 19, a dielectric structure 2E disposed between a first electrode 21 and the second electrode 22 includes barrier layers B1 and B2 and a photoelectric conversion layer 23A. The barrier layer B1 disposed between the first electrode 21 and the photoelectric conversion layer 23A may be the hole blocking layer 20h described above or the insulating layer 29a described above. Specifically, the barrier layer B1 is a layer having the function of suppressing at least transport of holes from the photoelectric conversion layer (the photoelectric conversion layer 23A in this case) to the first electrode 21. The barrier layer B2 disposed between the photoelectric conversion layer 23A and the second electrode 22 may be the electron blocking layer 20e described above or the insulating layer 29b described above. Specifically, the barrier layer B2 is a layer having the function of suppressing at least transport of electrons from the photoelectric conversion layer (the photoelectric conversion layer 23A in this case) to the second electrode 22.

By employing the capacitor structure exemplified in FIG. 19, light entering the photoelectric conversion layer 23A can be detected as a change in the capacitance value between the first electrode 21 and the second electrode 22. The light may enter from the first electrode 21 side or may enter from the second electrode 22 side. For example, when the first electrode 21 is a transparent electrode, the light may enter the photoelectric conversion layer 23A through the first electrode 21. Alternatively, when the substrate 2 is a transparent substrate and the second electrode 22 is a transparent electrode, the light may enter the photoelectric conversion layer 23A through the substrate 2 and the second electrode 22.

In FIG. 19, the voltage supply circuit 12 (see, for example, FIG. 2) is not illustrated and is omitted. In the structure in which the photodetection element (the photodetection element 10E in this case) is supported by the substrate (the substrate 2 in this case) as exemplified in FIG. 19, the voltage supply circuit 12 may be disposed on the substrate.

The change in the capacitance value between the first electrode 21 and the second electrode 22 may be detected, for example, in the following manner. First, an AC voltage is applied between the electrodes 21 and 22, and the change in electric current flowing between the electrodes 21 and 22 is detected. Let the frequency of the AC voltage be ω, the amplitude ratio of the voltage to the current be A, the difference in phase be δ, and tan δ be D. When an equivalent circuit between the electrodes 21 and 22 is a series circuit including a resistance component and a capacitance component, the capacitance can be computed from the following formula.

$$C_s = \frac{\sqrt{1+D^2}}{\omega A}$$

When the equivalent circuit between the electrodes 21 and 22 is a parallel circuit including a resistance component and a capacitance component, the capacitance can be computed from the following formula.

$$C_p = \frac{1}{\omega A \sqrt{1+D^2}}$$

In actual measurement, an appropriate one of the above two formulas can be selected according to the structure of the element and the frequency of the AC voltage.

Figure 22:
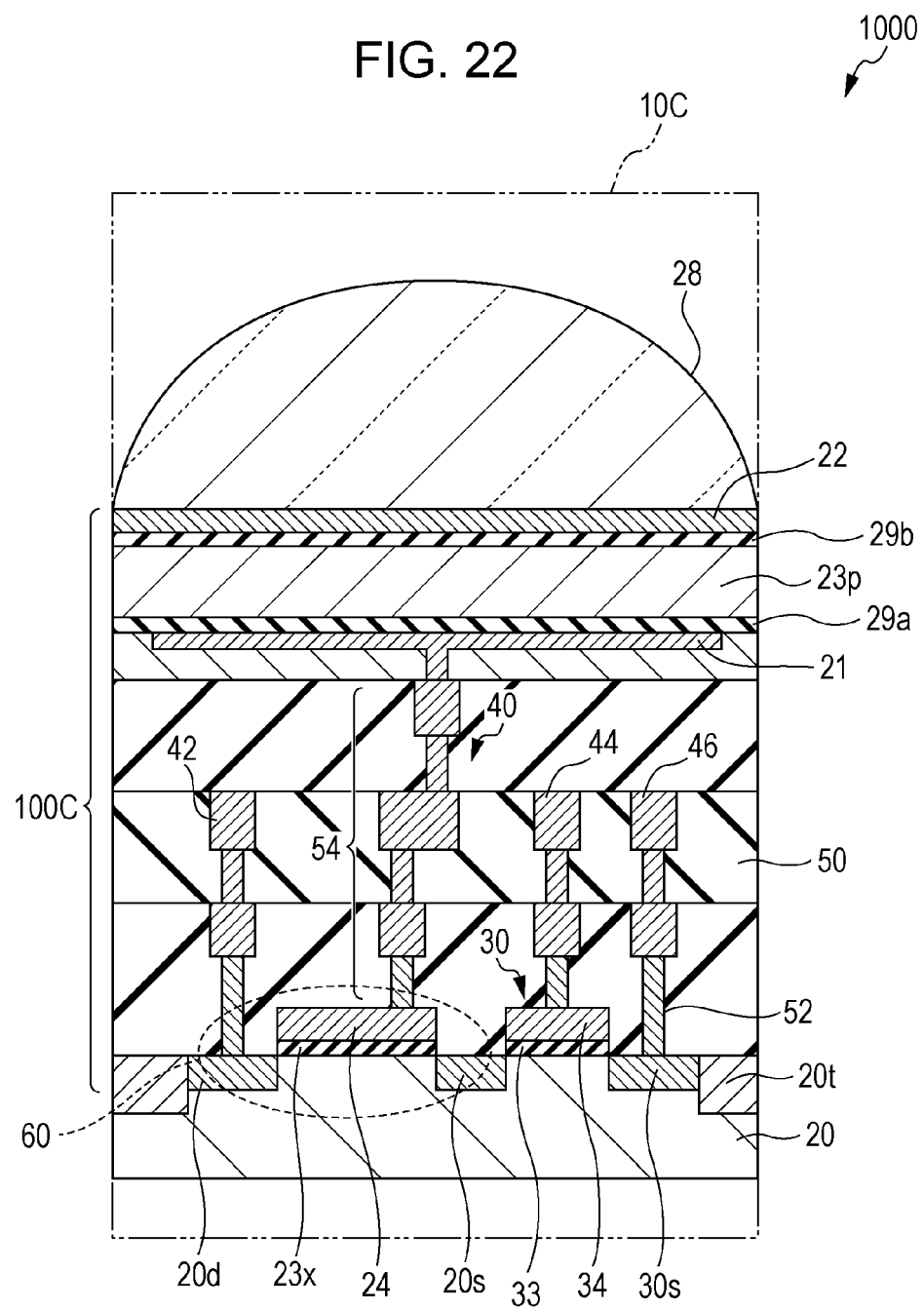
FIG. 22 is a schematic cross-sectional view showing still another example of the device structure of the photodetection element.

A different detection method will be described with reference to FIG. 22. FIG. 22 schematically shows a cross section of a photodetector including the capacitor structure of the present disclosure.

In FIG. 22, a photosensor 100C includes a transistor 60 and a photoelectric conversion unit. The transistor 60 is a field effect transistor formed on a semiconductor substrate 20. The transistor 60 includes an impurity region 20d, an impurity region 20s, an insulating layer 23x on the semiconductor substrate, and a gate electrode 24 on the insulating layer 23x. The impurity region 20d functions as a drain region (or a source region) of the transistor 60, and the impurity region 20s function as the source region (or the drain region) of the transistor 60. The impurity region 20d is connected to a power source line 42, so that a prescribed voltage can be applied to the impurity region 20d during operation of the photodetector 1000. The insulating layer 23x functions as a gate insulating layer of the transistor 60. The insulating layer 23x is, for example, a thermally oxidized silicon film having a thickness of 4.6 nm.

The photoelectric conversion unit of the photosensor 100C includes a pixel electrode 21, a transparent electrode 22 facing the pixel electrode 21, and a photoelectric conversion layer 23p sandwiched therebetween. An insulating layer 29a is disposed between the pixel electrode 21 and the photoelectric conversion layer 23p, and an insulating layer 29b is disposed between the photoelectric conversion layer 23p and the transparent electrode 22. The pixel electrode 21 is disposed so as to be spaced apart from adjacent unit pixel cells 10C. Therefore, the pixel electrode 21 is electrically isolated from pixel electrodes 21 of other unit pixel cells 10C. The pixel electrode 21 is typically a metal electrode or a metal nitride electrode. Examples of the material for forming the pixel electrode 21 include Al, Cu, Ti, TiN, Ta, TaN, Mo, Ru, and Pt. The pixel electrode 21 may be formed from polysilicon doped with an impurity to impart electrical conductivity. In the above case, the pixel electrode 21 used is a TiN electrode.

For example, a material through which a smaller leakage current can flow than through the material forming the photoelectric conversion layer 23p may be selected as the material forming the insulating layers 29a and 29b. In this case, a silicon oxide film having a thickness of 5.4 nm is used for the insulating layers 29a and 29b. The silicon oxide film can be formed by, for example, CVD.

The photoelectric conversion layer 23p is formed so as to extend over other unit pixel cells 10C. The thickness of the photoelectric conversion layer 23p may be, for example, about 200 nm. The transparent electrode 22 is formed using a transparent conducting oxide (TCO) so as to extend over other unit pixel cells 10C. The transparent electrode 22 is connected to a gate voltage control line (not illustrated), so that a prescribed voltage can be applied to the transparent electrode 22 during operation of the photodetector 1000.

In the example illustrated, the transparent electrode 22 and the photoelectric conversion layer 23p are disposed above an interlayer insulating layer 50, and the pixel electrode 21 of the photoelectric conversion unit is connected to the gate electrode 24 of the capacitance-modulated transistor 60 through a connection portion 54 including part of multilayer wiring 40 and a contact plug 52.

In the example described, a first voltage applied to the impurity region 20d is 1.2 V, and a second voltage applied to the transparent electrode 22 is 3.7 V. Specifically, in this example, a potential difference of about 2.5 V is applied between the impurity region 20d and the transparent electrode 22.

Figure 23:
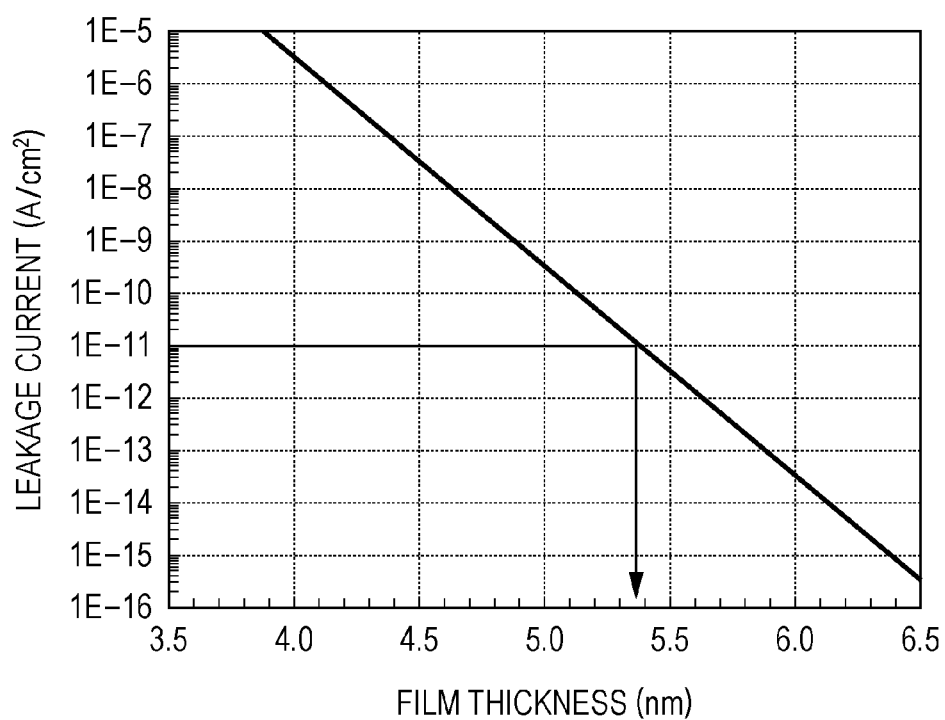
FIG. 23 is a graph showing the film thickness dependence of a leakage current flowing through a silicon oxide film when a voltage of 2.5 V is applied.

FIG. 23 shows the film thickness dependence of a leakage current flowing through the silicon oxide film when a voltage of 2.5 V is applied. In terms of maintaining the characteristics with no light irradiation, it is beneficial that the leakage current to the channel region of the capacitance-modulated transistor 60 is $1\times10^{-11}$ A/cm² or less. As shown in FIG. 23, in the case in which a voltage of 2.5 V is applied to the silicon oxide film, the leakage current through the silicon oxide film can be reduced to $1\times10^{-11}$ A/cm² or less when the thickness of the silicon oxide film is 5.4 nm or more.

When light enters the photoelectric conversion layer 23p, hole-electron pairs are generated in the photoelectric conversion layer 23p, and the permittivity of the photoelectric conversion layer 23p changes. As the permittivity of the photoelectric conversion layer 23p changes, the effective gate voltage of the capacitance-modulated transistor 60 changes, and a drain current in the capacitance-modulated transistor 60 changes. Therefore, the change in illuminance can be detected as, for example, a change in voltage in a vertical signal line 46.

In another detection method, a fixed capacitor connected in series to the electrode 21 or 22 in the capacitor structure exemplified in FIG. 19 is further provided. With a constant voltage applied between two electrodes not used for the mutual connection between the fixed capacitor and the electrode, an intermediate voltage between the capacitor structure and the fixed capacitor is read, whereby the change in illuminance can be detected.

The fixed capacitor has a structure in which an insulating material using an oxide film, a nitride film, or an organic film is sandwiched between two electrodes and a change in capacitance in response to light is small (the capacity can be regarded as a constant).

To read the change in the capacitance of the capacitor structure efficiently, it is desirable to design the capacitor structure such that the initial capacitance value of the capacitor structure under the condition in which no light enters the capacitor structure is lower than the capacitance value of the fixed capacitor.

It is also desirable to set the positional relation between the fixed capacitor and the capacitor structure such that the capacitor structure is disposed on the light incident side.

Let the constant voltage applied be VG, the capacitance value of the capacitor structure be C1, and the capacitance value of the fixed capacitor be C2. Then the intermediate voltage can be represented by a formula below. Using this formula, the change in the capacitance of the capacitor structure due to the incident light can be read as a change in voltage.

$$V = \frac{C1}{C1+C2} VG$$

To read the voltage, a transistor can be used, and the signal can be read nondestructively through connection to the gate electrode side of the transistor.

The photodetection element in the photosensor of the present disclosure can be configured as a three-terminal element. Other specific examples of the device structure of the photodetection element will be described with reference to FIGS. 20 and 21.

Figure 20:
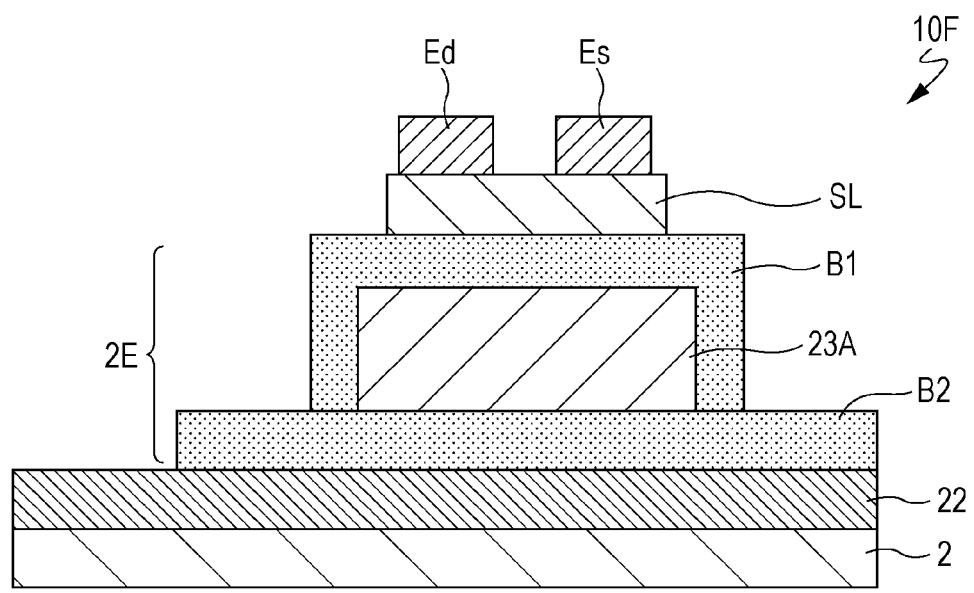
FIG. 20 is a schematic cross-sectional view showing another example of the device structure of the photodetection element.

FIG. 20 shows another example of the device structure of the photodetection element. The photodetection element 10F shown in FIG. 20 has a device structure similar to the device structure of the photodetection element 10E described with reference to FIG. 19. However, the structure exemplified in FIG. 20 differs from the photodetection element 10E shown in FIG. 19 in that, instead of the first electrode 21, a semiconductor layer SL, an electrode Ed, and an electrode Es are disposed on the barrier layer B1. As illustrated, the electrode Ed and the electrode Es are disposed on the semiconductor layer SL so as to be spaced apart from each other. As can be seen from FIG. 20, the photodetection element 10F has the device structure similar to a bottom gate thin film transistor. Examples of the material forming the semiconductor layer SL include single-walled carbon nanotubes (SWCNTs), oxide semiconductors including In—Ga—Zn—O-based (IGZO) semiconductors, organic semiconductors such as pentacene and P3HT, and amorphous silicon.

For example, suppose that light enters the photoelectric conversion layer 23A through the substrate 2 and the second electrode 22. In this case, when the first voltage is applied to one of the electrode Ed and the electrode Es and when the second voltage is applied to the second electrode 22, the permittivity of the dielectric structure 2E changes. When the permittivity of the dielectric structure 2E increases, electric charges are induced in the semiconductor layer SL, and a current flowing between the electrode Ed and the electrode Es changes. Therefore, a signal corresponding to the illuminance of the light can be taken from the other one of the electrodes Ed and Es to which the first voltage is not applied.

Figure 21:
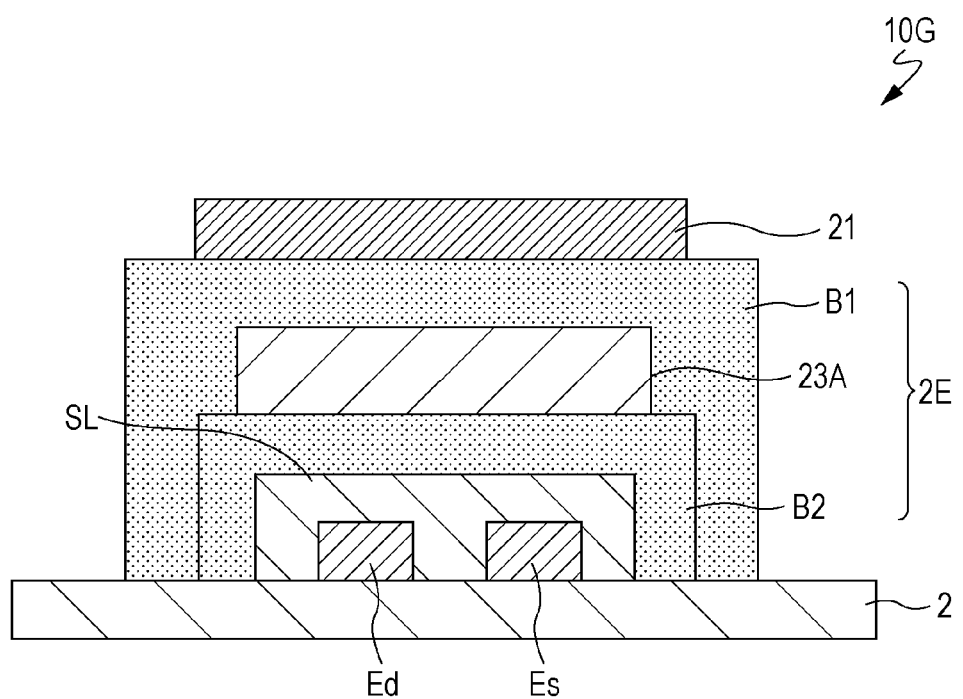
FIG. 21 is a schematic cross-sectional view showing yet another example of the device structure of the photodetection element.

FIG. 21 shows another example of the device structure of the photodetection element. As exemplified in FIG. 21, a device structure similar to a top gate thin film transistor can be used. In this example, a semiconductor layer SL is disposed so as to cover electrodes Ed and Es spaced apart from each other, and a dielectric structure 2E is disposed on the semiconductor layer SL. A first electrode 21 is disposed on the dielectric structure 2E.

When light is detected using the photodetection element 10G shown in FIG. 21, the first voltage is applied to, for example, the first electrode 21, and the second voltage is applied to one of the electrode Ed and the electrode Es. In this case, as in the photodetection element 10F described above, a signal corresponding to the illuminance of the light can be taken from the other one of the electrodes Ed and Es to which the first voltage is not applied.

In the structure shown in FIG. 20, the placement positions of the barrier layers B1 and B2 may be exchanged. In this case, the electric potential at one of the electrode Ed and the electrode Es is set to be higher than the electric potential at the second electrode 22 during detection of light. Similarly, in the structure exemplified in FIG. 21, the placement positions of the barrier layers B1 and B2 may be exchanged. In this case, the electric potential at one of the electrode Ed and the electrode Es is set to be lower than the electric potential at the first electrode 21 during detection of light. In the semiconductor layer SL, carriers induced in a region sandwiched between the electrode Ed and the electrode Es may be electrons or may be holes.

As described above, in the embodiments of the present disclosure, electric charges generated by photoelectric conversion are retained in the photoelectric conversion layer and used as electric charges contributing to the change in the permittivity of the dielectric structure including the photoelectric conversion layer. In the embodiments of the present disclosure, movement of electric charges between the photoelectric conversion layer and the electrodes is suppressed. By using the photosensor according to any of the above embodiments, an electric signal corresponding to the change in permittivity due to light irradiation can be taken from the photosensor.

In the structures exemplified in the above embodiments, the photoelectric conversion material exhibiting absorption in the infrared range is used for the photoelectric conversion layer. The photoelectric conversion material exhibiting absorption in the infrared range has a narrow bandgap, and therefore dark current increases as the number of thermally excited carriers increases and the value of electrical resistance decreases. Therefore, when the photoelectric conversion material exhibiting absorption in the infrared range is used as the material of the photoelectric conversion layer, a sufficient S/N ratio may not be obtained. However, in the embodiments of the present disclosure, since a barrier layer is disposed between the photoelectric conversion layer and at least one of the two electrodes, leakage to the electrode can be reduced. In addition, the potential barrier of the barrier layer can suppress injection of electric charges from the electrode to the photoelectric conversion layer. For example, by reading the change in permittivity when the potential difference between the electrodes is changed, fixed noise due to thermal excitation etc. can be removed. Therefore, a low-noise infrared photosensor can be obtained using the photoelectric conversion material exhibiting absorption in the infrared range.

In the embodiments of the present disclosure, holes and electrons generated by photoelectric conversion are separated from each other by forming an electric field in the photoelectric conversion layer. Therefore, an organic compound in which the time until recombination of holes and electrons is generally relatively short can be relatively easily used as the material of the photoelectric conversion layer.

As described above, according to the embodiments of the present disclosure, a photosensor having sensitivity in the infrared range can be obtained using a relatively simple structure. In the photosensor according to any of the embodiments of the present disclosure, infrared light is detected not through heat, and therefore it is not necessary to provide a cooling mechanism.

The photosensor of the present disclosure is applicable to photodetectors, image sensors, etc. By appropriately selecting the material of the photoelectric conversion layer, an image can be acquired using infrared light. The photosensor that captures an image using infrared light can be used for, for example, security cameras, vehicle-mounted cameras, etc. A vehicle-mounted camera can be used for, for example, input into a controller in order to allow the vehicle to drive safely. The vehicle-mounted camera can also be used to assist the operator in order to allow the vehicle to drive safely.

What is claimed is:

1. A photosensor comprising:
    a first electrode;
    a second electrode facing the first electrode;
    a photoelectric conversion layer located between the first electrode and the second electrode, the photoelectric conversion layer generating electric charges by photoelectric conversion;
    a first charge blocking layer located between the first electrode and the photoelectric conversion layer;
    a second charge blocking layer located between the second electrode and the photoelectric conversion layer;
    a voltage supply circuit connected to at least one of the first electrode and the second electrode, the voltage supply circuit being configured to apply a voltage to the at least one of the first electrode and the second electrode such that an electric field directed from the second electrode toward the first electrode is generated in the photoelectric conversion layer; and
    a detection circuit is configured to detect a signal corresponding to a change in capacitance between the first electrode and the second electrode, wherein:
    under the electric field directed from the second electrode toward the first electrode being generated, the first charge blocking layer is configured to suppress movement of holes generated in the photoelectric conversion layer from the photoelectric conversion layer to the first electrode and movement of electrons from the first electrode to the photoelectric conversion layer, so that the holes generated in the photoelectric conversion layer is confined in the photoelectric conversion layer,
    under the electric field directed from the second electrode toward the first electrode being generated, the second charge blocking layer is configured to suppress movement of electrons generated in the photoelectric conversion layer from the photoelectric conversion layer to the second electrode and movement of holes from the second electrode to the photoelectric conversion layer, so that the electrons generated in the photoelectric conversion layer is confined in the photoelectric conversion layer, and
    the change in capacitance is caused by the holes and the electrons, which are generated by incident light to the photoelectric conversion layer and confined in the photoelectric conversion layer.

2. The photosensor according to claim 1, wherein
    the voltage supply circuit applies a voltage to one of the first electrode and the second electrode, and
    the detection circuit detects a voltage of the other one of the first electrode and the second electrode.

3. The photosensor according to claim 2, further comprising
    a capacitor having a first end connected to the other one of the first electrode and the second electrode and a second end to which a prescribed voltage is applied.

4. The photosensor according to claim 1, further comprising:
    a semiconductor layer located between the second charge blocking layer and the second electrode, the semiconductor layer being in contact with the second electrode; and
    a third electrode in contact with the semiconductor layer, wherein
    the voltage supply circuit applies a voltage to the first electrode and the second electrode, and
    the detection circuit detects an electric current flowing between the second electrode and the third electrode.

5. The photosensor according to claim 1, further comprising:
    a semiconductor layer located between the first charge blocking layer and the first electrode, the semiconductor layer being in contact with the first electrode; and
    a third electrode in contact with the semiconductor layer, wherein
    the voltage supply circuit applies a voltage to the first electrode and the second electrode, and
    the detection circuit detects an electric current flowing between the first electrode and the third electrode.

6. The photosensor according to claim 1, wherein
    the voltage supply circuit applies, between the first electrode and the second electrode, a voltage obtained by superimposing a first voltage on a second voltage, the first voltage having an amplitude that varies periodically, the second voltage being a DC voltage that causes an electric field directed from the second electrode toward the first electrode to be generated in the photoelectric conversion layer, and the detection circuit detects an electric current flowing between the first electrode and the second electrode.

7. The photosensor according to claim 1, further comprising a current supply circuit that applies, between the first electrode and the second electrode, an electric current having an amplitude that varies periodically, wherein the voltage supply circuit applies a DC voltage between the first electrode and the second electrode such that an electric field directed from the second electrode toward the first electrode is generated in the photoelectric conversion layer, and the detection circuit detects a potential difference between the first electrode and the second electrode.

8. The photosensor according to claim 1, wherein the HOMO level of the first charge blocking layer is deeper than the HOMO level of the photoelectric conversion layer by at least 0.3 eV, and the LUMO level of the first charge blocking layer is shallower than the Fermi level of the first electrode by at least 0.3 eV.

9. The photosensor according to claim 1, wherein the LUMO level of the second charge blocking layer is shallower than the LUMO level of the photoelectric conversion layer by at least 0.3 eV, and the HOMO level of the second charge blocking layer is deeper than the Fermi level of the second electrode by at least 0.3 eV.

10. The photosensor according to claim 1, wherein at least one of the first charge blocking layer and the second charge blocking layer is an insulating layer.

11. A photosensor comprising:

a first electrode;

a second electrode facing the first electrode;

a photoelectric conversion layer located between the first electrode and the second electrode, the photoelectric conversion layer generating electric charges by photoelectric conversion;

a first insulating layer located between the first electrode and the photoelectric conversion layer;

a second insulating layer located between the second electrode and the photoelectric conversion layer;

a voltage supply circuit connected to at least one of the first electrode and the second electrode, the voltage supply circuit being configured to apply a voltage to the at least one of the first electrode and the second electrode such that an electric field is generated in the photoelectric conversion layer;

a detection circuit configured to detect a signal corresponding to a change in capacitance between the first electrode and the second electrode, the change in capacitance being caused by incident light to the photoelectric conversion layer;

a semiconductor layer located between the second insulating layer and the second electrode, the semiconductor layer being in contact with the second electrode; and a third electrode in contact with the semiconductor layer, wherein:

the voltage supply circuit applies a voltage to the first electrode and the second electrode, and the detection circuit detects an electric current flowing between the second electrode and the third electrode.

12. A photosensor comprising:

a first electrode;

a second electrode facing the first electrode;

a photoelectric conversion layer located between the first electrode and the second electrode, the photoelectric conversion layer generating electric charges by photoelectric conversion;

a first insulating layer located between the first electrode and the photoelectric conversion layer;

a second insulating layer located between the second electrode and the photoelectric conversion layer;

a voltage supply circuit connected to at least one of the first electrode and the second electrode, the voltage supply circuit being configured to apply a voltage to the at least one of the first electrode and the second electrode such that an electric field is generated in the photoelectric conversion layer; and a detection circuit configured to detect a signal corresponding to a change in capacitance between the first electrode and the second electrode, the change in capacitance being caused by incident light to the photoelectric conversion layer, wherein:

the voltage supply circuit applies, between the first electrode and the second electrode, a voltage obtained by superimposing a first voltage on a second voltage, the first voltage having an amplitude that varies periodically, the second voltage being a DC voltage that causes an electric field directed from the second electrode toward the first electrode to be generated in the photoelectric conversion layer, and the detection circuit detects an electric current flowing between the first electrode and the second electrode.

13. A photosensor comprising:

a first electrode;

a second electrode facing the first electrode;

a photoelectric conversion layer located between the first electrode and the second electrode, the photoelectric conversion layer generating electric charges by photoelectric conversion;

a first insulating layer located between the first electrode and the photoelectric conversion layer;

a second insulating layer located between the second electrode and the photoelectric conversion layer;

a voltage supply circuit connected to at least one of the first electrode and the second electrode, the voltage supply circuit being configured to apply a voltage to the at least one of the first electrode and the second electrode such that an electric field is generated in the photoelectric conversion layer;

a detection circuit configured to detect a signal corresponding to a change in capacitance between the first electrode and the second electrode, the change in capacitance being caused by incident light to the photoelectric conversion layer; and a current supply circuit that applies, between the first electrode and the second electrode, an electric current having an amplitude that varies periodically, wherein:

the voltage supply circuit applies a DC voltage between the first electrode and the second electrode such that an electric field directed from the second electrode toward the first electrode is generated in the photoelectric conversion layer, and the detection circuit detects a potential difference between the first electrode and the second electrode.

* * * * *